(12) United States Patent
Hadame et al.

(10) Patent No.: US 7,842,526 B2
(45) Date of Patent: Nov. 30, 2010

(54) LIGHT EMITTING DEVICE AND METHOD OF PRODUCING SAME

(75) Inventors: Kunihiro Hadame, Aichi-ken (JP);
Yoshinobu Suehiro, Aichi-ken (JP)

(73) Assignee: Toyoda Gosei Co., Ltd.,
Nishikasugai-gun, Aichi-ken (JP)

( * ) Notice: Subject to any disclaimer, the term of this patent is extended or adjusted under 35 U.S.C. 154(b) by 129 days.

(21) Appl. No.: 11/220,903

(22) Filed: Sep. 8, 2005

(65) Prior Publication Data
US 2006/0054913 A1 Mar. 16, 2006

(30) Foreign Application Priority Data
Sep. 9, 2004 (JP) .............................. 2004-262906
Jul. 20, 2005 (JP) .............................. 2005-210623

(51) Int. Cl.
*H01L 21/00* (2006.01)
(52) U.S. Cl. ................................. 438/29; 257/E33.068
(58) Field of Classification Search .................. 257/79,
257/88, 89, 91, 98, 99, 100, E33.055–E33.074;
438/22, 26, 27, 28, 29, 30, 31, 32, 33, 34,
438/35, 38, 39, 40, 42, 43
See application file for complete search history.

(56) References Cited

U.S. PATENT DOCUMENTS

| 5,670,797 | A * | 9/1997 | Okazaki ........................ 257/91 |
| 6,639,251 | B1 * | 10/2003 | Hung et al. .................... 257/99 |
| 6,707,247 | B2 | 3/2004 | Murano |
| 2002/0063301 | A1 | 5/2002 | Hanamoto et al. |
| 2002/0070449 | A1 * | 6/2002 | Yagi et al. ..................... 257/734 |
| 2002/0185966 | A1 * | 12/2002 | Murano ........................ 313/501 |
| 2003/0230751 | A1 * | 12/2003 | Harada ......................... 257/80 |
| 2004/0169466 | A1 | 9/2004 | Suehiro et al. |
| 2004/0217364 | A1 * | 11/2004 | Tarsa et al. .................... 257/89 |
| 2006/0261364 | A1 | 11/2006 | Suehiro et al. |

FOREIGN PATENT DOCUMENTS

| JP | 53-073888 U | 6/1978 |
| JP | 02-238680 | 9/1990 |
| JP | 11-008414 | 1/1999 |
| JP | 11-177129 A | 7/1999 |
| JP | 2001-345482 | 12/2001 |
| JP | 2002-171000 | 6/2002 |

(Continued)

OTHER PUBLICATIONS

Japanese Office Action dated Apr. 14, 2009 with partial English-language translation.

(Continued)

*Primary Examiner*—Sue Purvis
*Assistant Examiner*—Kevin Quinto
(74) *Attorney, Agent, or Firm*—McGinn IP Law Group, PLLC

(57) ABSTRACT

A light emitting device having: a light emitting element; an electricity supply portion on which the light emitting element is mounted and which supplies electricity; and an inorganic sealing material for sealing the light emitting element. The inorganic sealing material has a tapered surface which becomes wider outward in a side surface direction with respect to a center axis of the light emitting element.

9 Claims, 24 Drawing Sheets

FOREIGN PATENT DOCUMENTS

| | | |
|---|---|---|
| JP | 2002-314142 | 10/2002 |
| JP | 2002-368286 A | 12/2002 |
| JP | 2003-101077 A | 4/2003 |
| JP | 2004-207367 | 7/2004 |
| WO | WO 2004/082036 | 9/2004 |

OTHER PUBLICATIONS

Japanese Office Action dated Jun. 30, 2009 (with partial English translation).

Japanese Office Action dated Jun. 15, 2010 (with partial English translation).

* cited by examiner

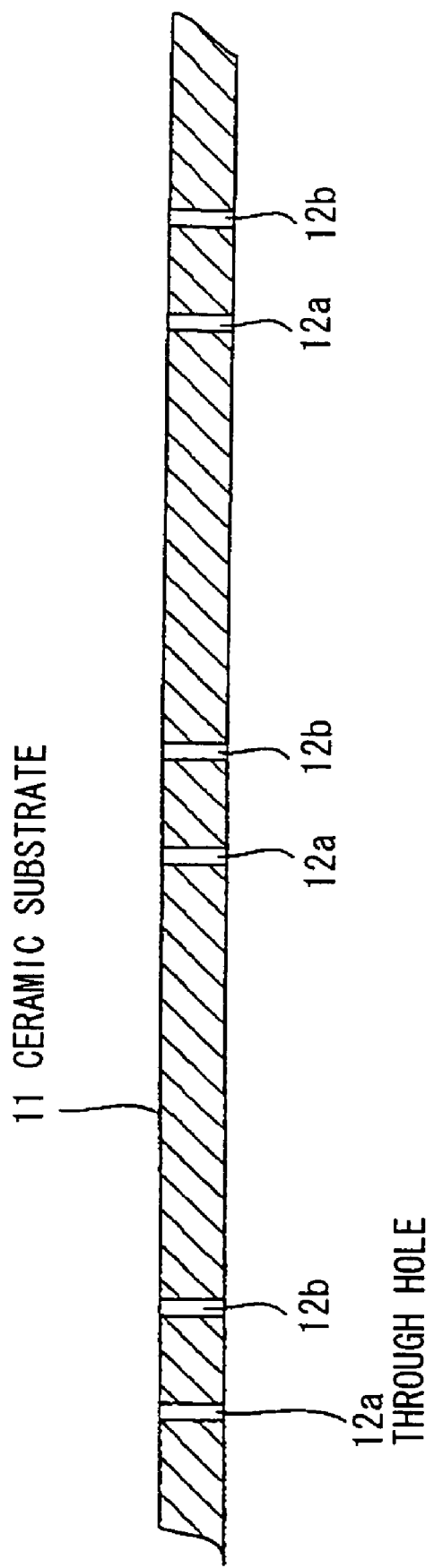

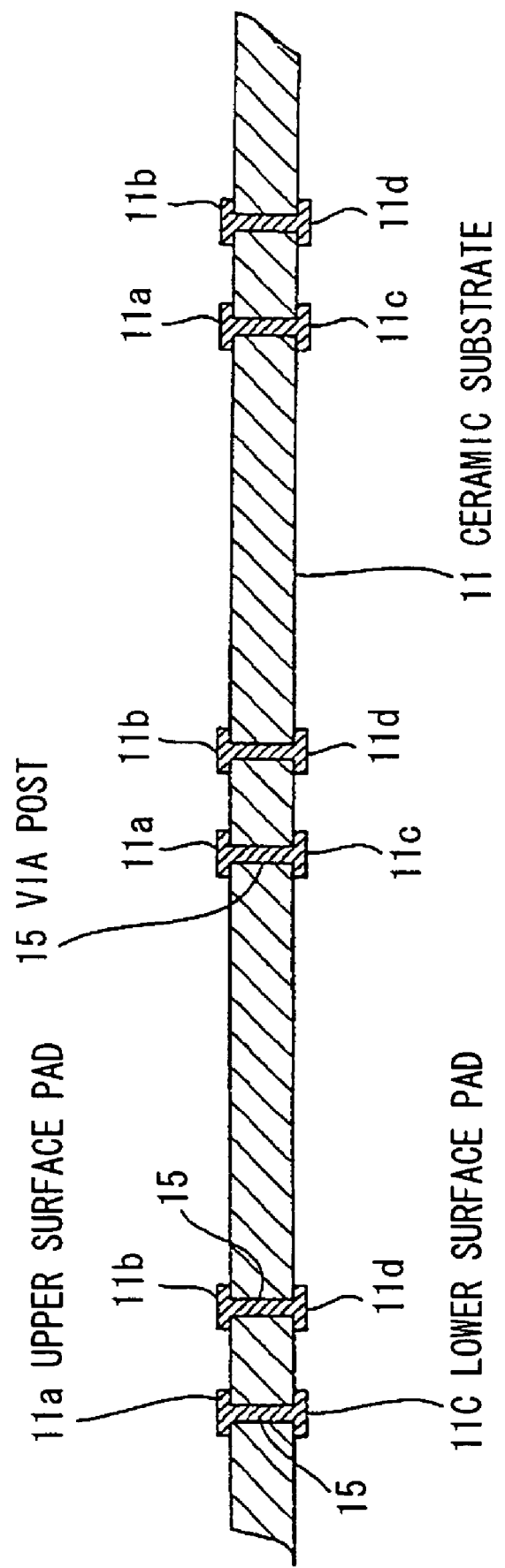

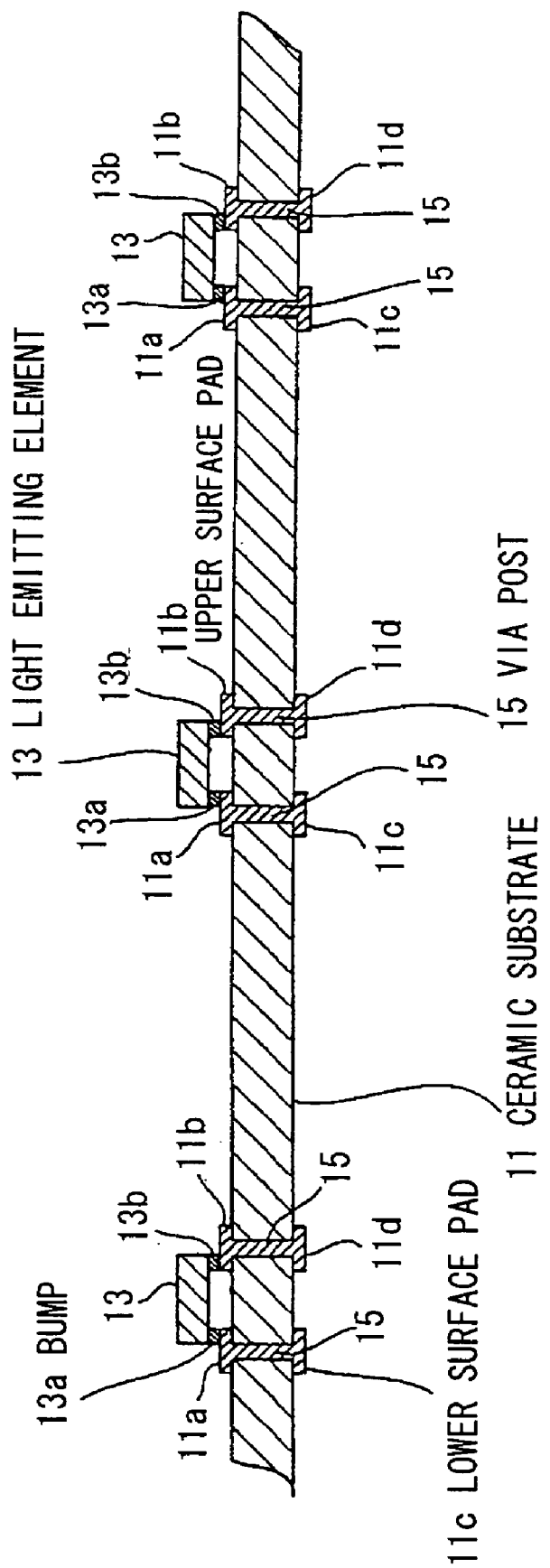

1 LIGHT EMITTING DEVICE
14 GLASS SEALING MEMBER
11a
13
11
32
11b UPPER SURFACE PAD 1
31 PHOSPHOR
32 PLATE MATERIAL
14 GLASS SEALING MEMBER
30 WHITE RESIN PORTION
13 LIGHT EMITTING ELEMENT
13b BUMP
11b UPPER SURFACE PAD
13a
11a
12b THROUGH HOLE
12a THROUGH HOLE
11c
11d LOWER SURFACE PAD
15
15 VIA POST
11 CERAMIC SUBSTRATE

LIGHT EMITTING DEVICE AND METHOD OF PRODUCING SAME

The present application is based on Japanese patent application Nos. 2004-262906 and 2005-210623, the entire contents of which are incorporated herein by reference.

BACKGROUND OF THE INVENTION

1. Field of the Invention

The present invention relates to a light emitting device capable of preventing damage caused by thermal expansion and high temperature which are ascribable to a sealing material, and capable of enhancing light extracting efficiency, and the invention also relates to a method of producing the light emitting device.

The invention also relates to a light emitting device having a phosphor layer on the light emitting side and in which an LED element is sealed with a glass sealing member, and the invention also relates to a method of producing the light emitting device.

Herein, a light emitting element is also referred to as LED element.

2. Description of the Related Art

Japanese Patent Application Laid-open No. 2002-314142 discloses a light emitting device in which a light emitting element is sealed with a sealing material made of silicon resin.

FIG. 15 is a sectional view showing a conventional light emitting device. This light emitting device 100 includes a resin portion 101 having a recess 101A, leads 102 and 103 formed in the resin portion 101 by insert molding, a light emitting element 105 mounted on the lead 102 exposed from a bottom surface of a recess 101A through an adhesive 104 such as a silver (Ag) paste, bonding wires 106 and 107 made of gold (Au) for connecting two electrodes (not shown) of the light emitting element 105 to the leads 102 and 103, a sealing body 109 including a phosphor 108 and charged into the recess 101A, and a reflection film 110 formed on an inner surface of the recess 101A.

The leads 102 and 103 are formed by cutting predetermined portions from a lead frame, and one ends thereof are closely opposed to each other, and the other ends thereof extend in the opposite directions, and pulled out from the resin portion 101.

The recess 101A is of a substantially elliptic shape or circular shape having an inclined surface whose inner diameter is reduced downwardly. The reflection film 110 is formed on the entire region of the inclined surface of the recess 101A using aluminum or the like.

The light emitting element 105 is of a laminated structure having a light emitting layer comprising a nitride semiconductor on a substrate using MOCVD (Metalorganic Chemical Vapor Deposition) or MBE (Molecular Beam Epitaxy).

The sealing body 109 is made of silicon resin. With this, sufficient durability can be obtained even with respect to short wavelength light having peak wavelength of less than 400 nm.

One or more kinds of phosphors 108 can be used. For example, when a plurality of kinds of phosphors are used, there is a combination of three kinds, i.e., a phosphor which emits red light, a phosphor which emits green light and a phosphor which emits blue light. Wavelength conversion can be carried out by the phosphor 110. When the phosphor 110 includes a red phosphor, a green phosphor and a blue phosphor, light such as ultraviolet light emitted from the light emitting element 105 is converted in wavelength by the phosphor 108, secondary light by them is mixed into primary light by the light emitting element 105, and this is extracted as emitting light of the light emitting device 100.

According to the light emitting device 100, since the phosphor 110 is included in the sealing body 109, the phosphor 110 absorbs the primary light by the light emitting element 105 and emits the visible light. Thus, it is possible to obtain a light emitting device 100 whose tone is not changed even if the light emitting wavelength of the light emitting element 105 is changed.

According to the conventional light emitting device, however, when the sealing body 109 is made of silicon resin, the sealing body has excellent weather resistance, light resistance, mechanical durability and the like, but since thermal expansion is generated, the bonding wires 106 and 107 are prone to be deformed at the time of sealing.

One example of a material having small thermal expansion is glass. Since the glass has high viscosity, it is necessary to increase the working temperature, and there is an adverse possibility that the light emitting element is damaged.

Further, if the reflection film 110 in the recess 101A is made of aluminum, since it metallic absorbs light, high reflection efficiency can not be obtained. When the reflection film is made of silver, it is blackened when it is deteriorated, and the reflection efficiency is lowered.

When white resin is used for the resin portion, light-gathering power can not be obtained, and sufficient light extracting efficiency can not be obtained.

In recent years, to eliminate harmful effect with respect to environment (human body) caused by mercury gas, and to reduce the consumed electricity cost, development of a light emitting device using light emitting diode (LED) element has started instead of using cold cathode fluorescent tube in which mercury gas is sealed.

Generally, when white illumination light is to be obtained as a light emitting device of this kind, red, green and blue LED elements, or blue-green and yellow LED elements are used.

There is also used a light emitting device capable of obtaining white light by exciting a phosphor which emits yellow by light emitted from a blue LED element.

Japanese Patent Application Laid-open No. 2001-345482 discloses a light emitting device having a casing including an electrode which opens toward a subject to be illuminated, an LED element accommodated in the casing, a resin mold member for sealing the LED element, and a plastic film including a phosphor for covering the resin mold member.

In this light emitting device, the LED element is an LED element which emits blue light, and the phosphor is excited by blue light and emits yellow light. White light in which emitted light having blue light emitted from the LED element and yellow wavelength conversion light emitted from the phosphor are mixed is emitted toward the light emitting side (toward subject to be illuminated).

According to the light emitting device disclosed in Japanese Patent Application Laid-open No. 2001-345482, however, the resin mold member is deteriorated by heat generated by light emitting of the LED element, the resin mold member is discolored and its transparency is deteriorated, and there is inconvenience that illumination light having high brightness can not be obtained for a long term.

SUMMARY OF THE INVENTION

It is an object of the present invention to provide a light emitting device capable of preventing damage caused by thermal expansion and high temperature which are ascribable to a sealing material, and capable of enhancing light extracting efficiency, and to provide a method of producing the light emitting device.

It is another object of the invention to provide a light emitting device having a phosphor layer capable of obtaining high brightness irradiation light and desired luminous intensity distribution characteristics for a long term, and to provide a method of producing the light emitting device.

(1) According to one aspect of the invention, a light emitting device comprises:

a light emitting element;

an electricity supply portion on which the light emitting element is mounted and which supplies electricity; and an inorganic sealing material for sealing the light emitting element, wherein the inorganic sealing material comprises a tapered surface that is wider outward in a side surface direction with respect to a center axis of the light emitting element.

(2) According to another aspect of the invention, a method of producing a light emitting device comprises:

a first step of mounting a plurality of surface mounting type light emitting elements on an insulative substrate at predetermined distances from one another;

a second step of forming a glass sealing member with uniform thickness such as to cover the plurality of light emitting elements; and a third step of cutting the substrate and the glass sealing member such that a tapered surface is formed around each of the plurality of light emitting elements.

In the light emitting device as described above in (1), the inorganic sealing material seals the light emitting element, and the tapered surface is provided on an outer surface of the inorganic sealing material. Thereby, damage caused by the thermal expansion and high temperature in using a resin material for sealing can be prevented, the light output can be prevented from being deteriorated, and excellent light gathering characteristics can be obtained.

In the method as described above in (2), after the glass sealing member is formed, the substrate and the glass sealing member are cut such that the tapered surface is formed around each of the light emitting elements. With this, the mass productivity and productivity can be enhanced. It is possible to easily form a light reflection surface having excellent light reflection ability without using a light reflection material.

(3) According to another aspect of the invention, a light emitting device comprises:

an LED element;

a sealing member made of glass for sealing the LED element;

a phosphor layer provided on the side of a light emitting surface of the sealing member; and a cover provided on the sealing member for preventing radiation light of the LED element from being emitted from a region where the phosphor layer of the sealing member is not provided.

(4) According to another aspect of the invention, a method of producing a light emitting device comprises:

a sealing step of sealing an LED element mounted on a element-mounting portion with a sealing member comprising glass;

a phosphor layer forming step of forming a phosphor layer on the side of a light emitting surface of the sealing member; and a step of forming a cover on the sealing member for preventing radiation light of the LED element from being emitted from a region where the phosphor layer of the sealing member is not provided.

In the light emitting device or method as described above in (3) and (4), the sealing member in the light emitting device having the LED element and the phosphor layer is made of glass instead of the conventional epoxy resin. It is conventionally common that phosphor is mixed into the epoxy resin to form the sealing member, but the epoxy resin is deteriorated and discolored by radiation light of the LED element, especially by the component of ultraviolet rays and with this, transparency is lowered and the brightness is lowered.

In the light emitting device, the sealing member is made of glass to prevent the brightness from being lowered. Since the glass prevents the deterioration caused by the ultraviolet rays, the sealing member is not discolored for long term use.

However, it is difficult to mix the phosphor into glass. If a ceramic substrate is used as the element-mounting portion, and if the thermal expansion coefficient is aligned to the ceramic substrate, it becomes necessary to use a high melting point glass as the glass. If the high melting point glass is used, the phosphor is mixed into glass in the high viscosity state, various problems such as reaction between phosphor and glass, difficult uniform dispersion, bubbles and the like are generated.

The present invention solves these problems by the following factors:

(i) the phosphor is painted on the glass sealing member in a layer form;

(ii) the phosphor is formed in the glass sealing member in a layer form; and (iii) resin into which phosphor is mixed is disposed on the glass sealing member in a layer form.

Further, to obtain desired luminous intensity distribution characteristics, the reflection surface for controlling the orientation of irradiation light is (iv) applied on the glass sealing member, and (v) high reflection resin material is formed into a molded body in a layer form and is provided on the glass sealing member by adhesion.

BRIEF DESCRIPTION OF THE DRAWINGS

FIG. 2 is a sectional view showing a wafer-like ceramic substrate in a first stage of a producing step;

FIG. 3 is a sectional view showing a step continued from FIG. 2;

FIG. 4 is a sectional view showing a step continued from FIG. 3;

DESCRIPTION OF THE PREFERRED EMBODIMENTS

First Embodiment (Structure of Light Emitting Device)

Figure 1A:
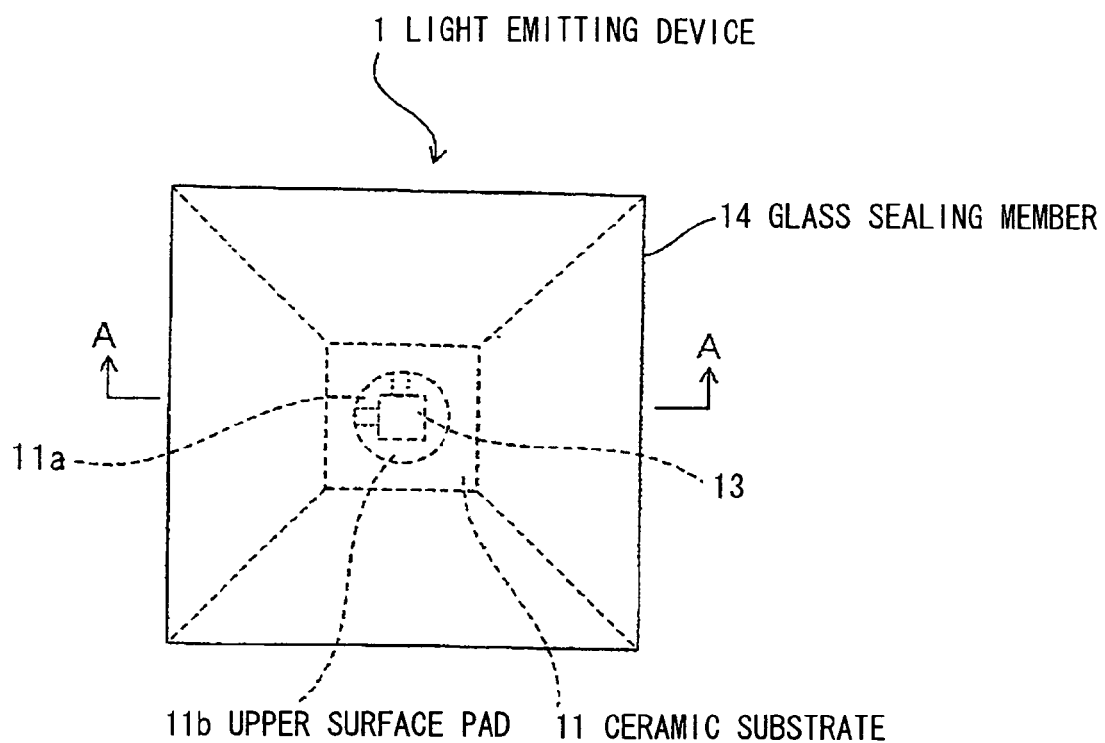
FIG. 1A is a plan view showing a light emitting device according to a first embodiment.
Figure 1B:
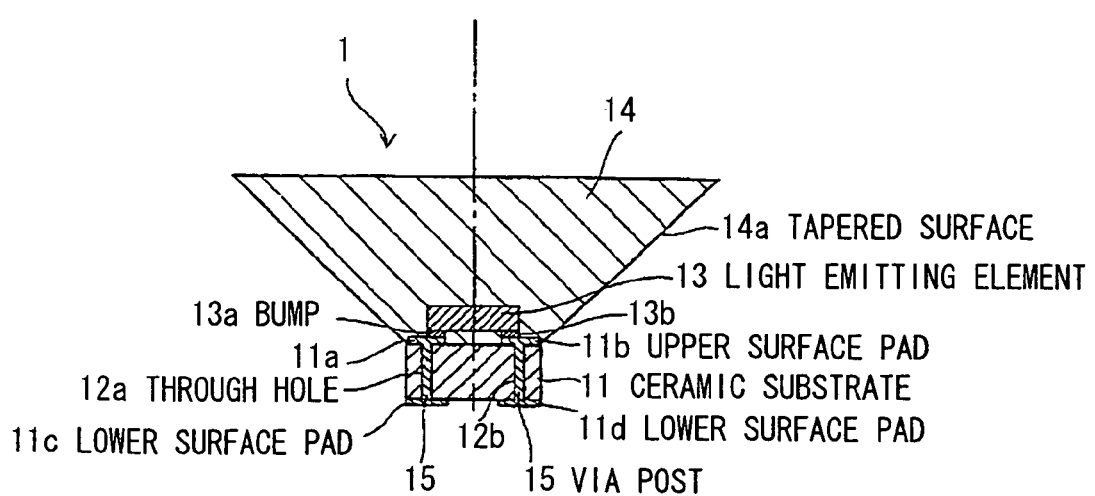
FIG. 1B is a sectional view taken along the line A-A in FIG. 1A.

FIG. 1A is a plan view showing a light emitting device according to a first embodiment, and FIG. 1B is a sectional view taken along the line A-A in FIG. 1A.

A light emitting device 1 includes a ceramic ($Al_2O_3$ including glass) substrate 11 formed with upper surface pads 11a and 11b and lower surface pads 11c and 11d, through holes 12a and 12b formed in the ceramic substrate 11 and into which via posts 15 made of Cu are embedded, a light emitting element 13 which is mounted on and connected to the upper surface pads 11a and 11b connected to the through holes 12a and 12b through bumps 13a and 13b, and a glass sealing member 14 which is sealed in a form of a reversed triangular shape such as to cover exposed portions on upper surfaces of the light emitting element 13 and the ceramic substrate 11.

In addition to $Al_2O_3$ including glass, it is possible to use $Al_2O_2$, AlN and the like as a material for the ceramic substrate 11.

The through hole 12a is formed such as to connect the upper surface pad 11a and the lower surface pad 11c to each other. Similarly, the through hole 12b is formed such as to connect the upper surface pad 11b and the lower surface pad 11d to each other.

The light emitting element 13 is of a flip chip type, and is provided at its mount surface with a pair of electrodes (not shown) which are connected to the upper surface pads 11a and 11b.

The glass sealing member 14 is made of phosphoric acid-based glass (thermal expansion coefficient is $11.4 \times 10^{-6}/°C.$, Tg390° C., n=1.59) as low melting point glass. The glass sealing member 14 is formed at its side surface with a tapered surface 14a whose cross sectional area in the lateral direction is increased upward. With this, the glass sealing member 14 has a reversed pyramid outer shape. This shape is obtained by dicing working as will be explained in the producing method.

FIGS. 2 to 7 show steps of the method of producing the light emitting device according to the first embodiment of the invention. Here, the method of producing the light emitting device 1 of the first embodiment will be explained.

(Method of Producing a Light Emitting Device 1)

FIG. 2 is a sectional view showing a wafer-like ceramic substrate in a first stage of a producing step. In this step, the upper surface and the lower surface of the ceramic substrate 11 are previously formed with wiring pattern (not shown). The through holes 12a and 12b are formed at constant distances from one another such as to be connected to the wiring pattern.

FIG. 3 is a sectional view showing a step continued from FIG. 2. The via posts 15 are embedded in the through holes 12a and 12b formed in FIG. 2. The upper surface pads 11a and 11b and the lower surface pads 11c and 11d are formed on the wiring pattern such that they are connected to the upper and lower surfaces of the through holes 12a and 12b.

FIG. 4 is a sectional view showing a step continued from FIG. 3. In this step, a light emitting element 13 which is previously formed with the bumps 13a and 13b is prepared. The surface of the light emitting element 13 on which the bumps 13a and 13b are formed is oriented downward, polarities are matched with each other and in this state, and the light emitting element 13 is mounted on the upper surface pads 11a and 11b. Filler having low thermal expansion coefficient may be charged between the ceramic substrate 11 and the light emitting element 13.

Figure 5:
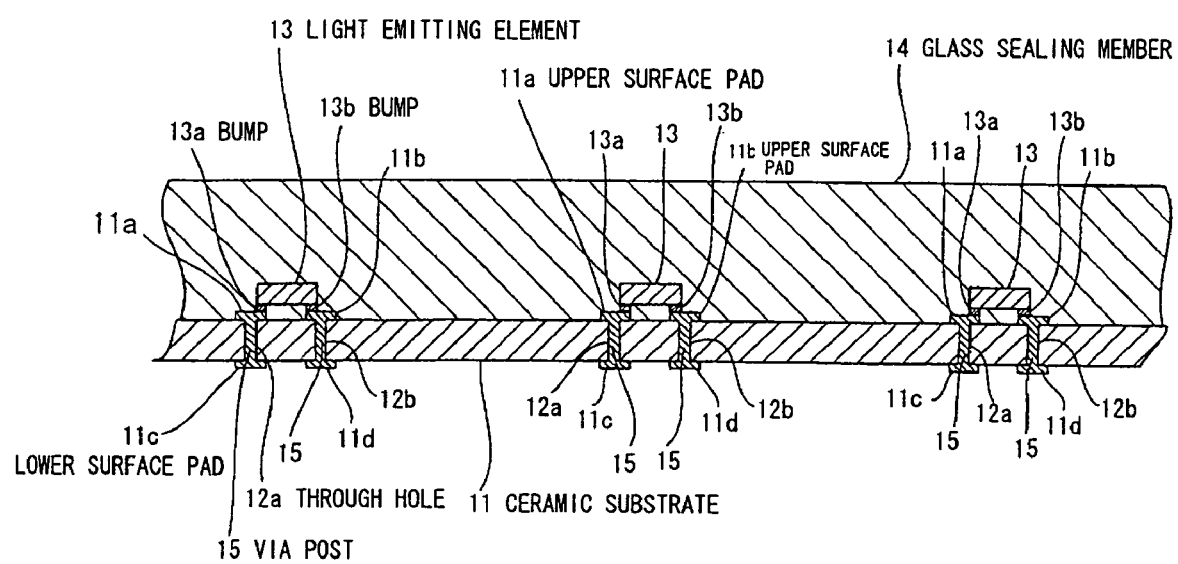
FIG. 5 is a sectional view showing a step continued from FIG. 4.

FIG. 5 is a sectional view showing a step continued from FIG. 4. In this step, the glass sealing member 14 made of phosphoric acid-based glass is thermocompression bonded by press. Its thickness is determined in accordance with size of the upper surface of the glass sealing member 14.

Figure 6:
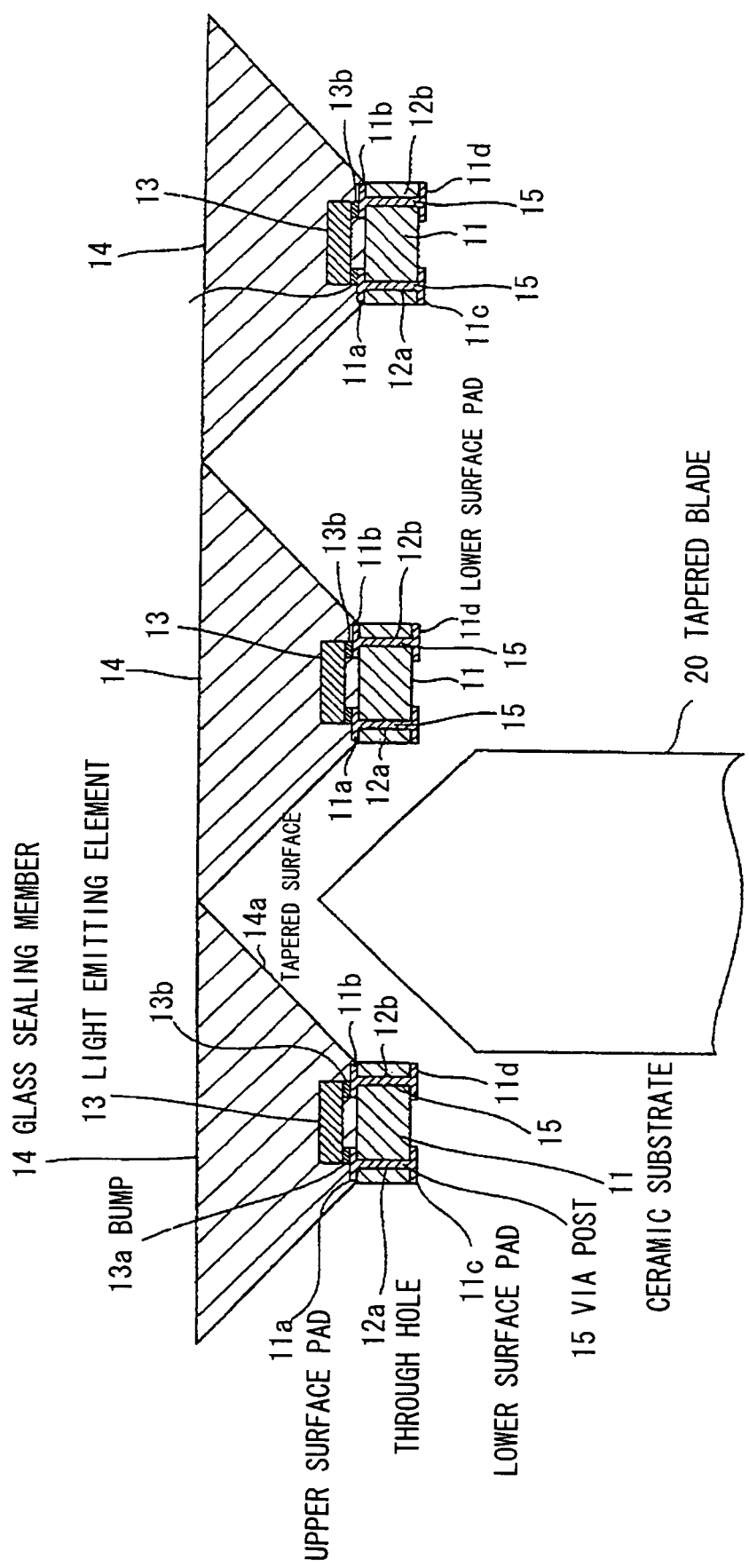
FIG. 6 is a sectional view showing a step continued from FIG. 5.
Figure 7:
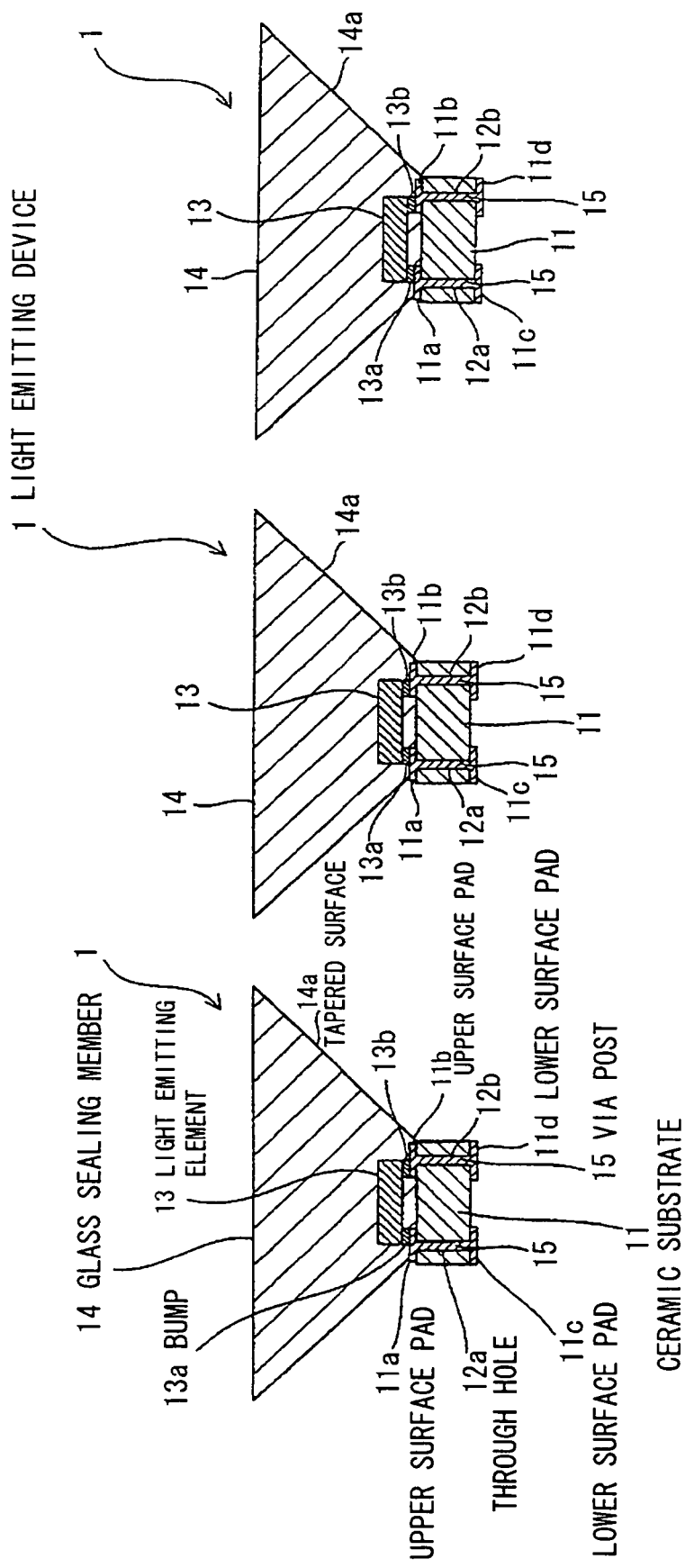
FIG. 7 is a sectional view showing a step continued from FIG. 6.

FIG. 6 is a sectional view showing a step continued from FIG. 5. In this step, at an intermediate position between adjacent light emitting elements 13, dicing of the ceramic substrate 11 and the glass sealing member 14 is carried out by a reversed-V shaped tapered blade 20. The tapered blade 20 is rotated and in this state, the tapered blade 20 is moved upward in FIG. 6 until its cutting edge reaches the upper surface of the glass sealing member 14 and the glass sealing member 14 is cut. Then, the cutting edge is rotated by 90°, and the dicing of the ceramic substrate 11 and the glass sealing member 14 is carried out in a direction perpendicular to the cutting direction. With this operation, tapered surfaces 14a are formed on four sides of the glass sealing member 14. When the dicing by the tapered blade 20 is completed, the light emitting elements 13 are separated, and the plurality of light emitting devices 1 having the same specification are completed as shown in FIG. 7.

Effect of the First Embodiment

According to the first embodiment, the following effects can be obtained.

(1) By carrying out hot press working in a high viscosity state using the low melting point glass, working can be carried out at sufficiently low temperature with respect to the crystal growth temperature.

(2) By adhering the ceramic substrate 11 and the glass sealing member 14 based on chemical bonding through oxide, strong sealing strength can be obtained. Thus, a small package having small bonding area can be realized.

(3) The thermal expansion coefficients of the sealing glass and the ceramic substrate 11 are equal to each other. Thus, after they are adhered at a high temperature, even if the temperature is lowered to normal or low temperature, adhesion failure such as peeling-off, crack and the like are not generated easily. Further, although glass is not cracked by tensile stress, the glass is less prone to be cracked by compression stress, and the sealing glass has slightly small thermal expansion coefficient with respect to the ceramic substrate 11. The present inventor has confirmed that peeling-off or crack was not generated even if a liquid-phase thermal impact test was repeated 1,000 times at $-40°$ C. $\leftrightarrow 100°$ C. To confirm the bonding base of a glass piece of 5 mm×5 mm with respect to the ceramic substrate 11, the glasses and ceramic substrates 11 were subjected to experiment with various combination of thermal expansion coefficients, and it was confirmed that the glass and the ceramic substrate could be bonded to each other without generating cracks when a ratio of a lower thermal expansion coefficient member to higher thermal expansion coefficient member was 0.85 or more. The expression that thermal expansion coefficients are equal to each other means the thermal expansion coefficients are in this range although it depends on rigidity, size and the like of the member.

(4) Wire is not required due to the flip chip bonding. Thus, inconvenience of electrode with respect to working in the high viscosity state is not generated. The viscosity of the low melting point glass at the time of sealing working is as hard as $10^8$ to $10^9$ poises, and properties are largely varied as compared with a fact that epoxy resin before it is subjected to thermal hardening processing is liquid state of about 5 poises. Thus, when a face-up type light emitting element which electrically connects an electrode on a surface of an element and an electricity-supply member such as a lead is to be sealed, the wire is crashed or deformed at the time of sealing working of glass in some cases, but such a problem is not caused. When the flip chip type light emitting element 13 in which an electrode on a surface of an element is bonded to an electricity-supply member such as a lead through a bump such as gold (Au) in a flip chip manner is sealed, pressure in the direction of the electricity-supply member is added to the light emitting element 13 based on the viscosity of the glass. With this, crash of the bump or short circuit between the bumps is generated, but this can be prevented also.

(5) A low melting point glass and the ceramic substrate 11 are set in parallel to each other, they are hot pressed in the high viscosity state, the low melting point glass is moved to the surface of the ceramic substrate 11 in parallel and is tightly adhered to the surface, a GaN-based light emitting element 13 is sealed and thus, no void is generated.

(6) Since a wiring circuit pattern 4 of the ceramic substrate 11 is pulled out toward a back surface at a via hole 3A, it is unnecessary to take any special measure to prevent glass from entering into unnecessary location or to prevent an electric terminal from being covered, and it is possible to easily produce a large number of light emitting devices 1 based on dicer cut only by collectively sealing a plate-like low melting point glass with respect to the plurality of devices. Since the low melting point glass is worked in the high viscosity state, it is unnecessary to take sufficient measure unlike the resin, and it is possible to produce sufficiently only if the external terminal is pulled out into the back surface without the need of the via hole.

(7) If the GaN-based light emitting element 13 is mounted in the flip manner, the problem caused when the glass seal is realized is overcome, and there is also an effect that a very small light emitting device 1 as small as 0.5 mm×0.5 mm can be realized. This is because a bonding space of the wire is not necessary, materials having the same thermal expansion coefficients are selected for the glass sealing member 14 and the ceramic substrate 11, they are strongly bonded to each other based on chemical bonding, and interface peel is not generated even if they are adhered to each other in a small space.

(8) By sealing the light emitting element 13 using the glass sealing member 14 made of low melting point glass as an inorganic material, durability and dampproofness can be secured with respect to the light deterioration, and heat generated at the time of light emission of the light emitting element 13 can swiftly be dispersed outside. Especially in the case of the GaN-based light emitting element 13, the output of the light emission is lowered mainly due to the deterioration of the sealing portion. Therefore, if the glass is sealed, a light emitting device 1 having extremely small output deterioration can be obtained. In the glass sealing material, material having greater index of refraction than that of the sealing material can be selected and thus, this is effective for enhancing the external radiation efficiency.

(9) Since the light emitting element 13 on the ceramic substrate 11 is sealed by the glass sealing member 14 made of the low melting point glass, it is possible to overcome the inconvenience caused when resin material is used for sealing. Therefore, it is possible to prevent the light output from being lowered.

(10) Since the side surface of the glass sealing member 14 is provided with the tapered surface 14a, light can be extracted from the glass sealing member 14 based on the total reflection at the tapered surface 14a, the light-extraction efficiency is enhanced, and excellent light gathering characteristics can be obtained.

Figure 15:
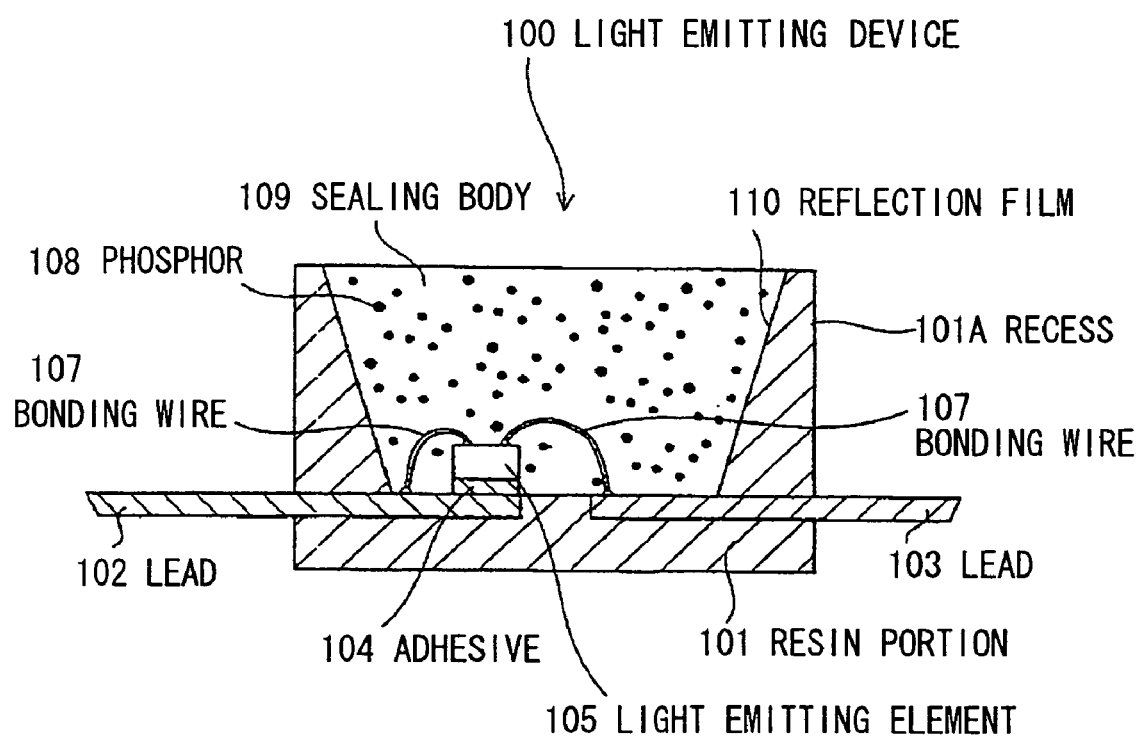
FIG. 15 is a sectional view showing a structure of a conventional light emitting device.

(11) Since the outer frame (FIG. 15, recess 101A) is unnecessary, a compact device can be obtained.

(12) The angle of the tapered surface 14a of the glass sealing member 14 can be adjusted using the angle of the cutting edge of the tapered blade 20. Therefore, troublesome operation such as angle setting at the time of cutting is unnecessary, the light emitting angle can easily be changed, and it is possible to easily meet requirement from a customer and an increase in variations of products.

(13) A plurality of light emitting elements 13 are provided on one wafer-like ceramic substrate 11 and then, the glass sealing members 14 are formed such as to cover all of the light emitting elements 13, and it is divided into a plurality of light emitting devices 1 each having the tapered surface by the tapered blade 20. With this, it is possible to easily form the light emitting device 1 having light-extraction structure based on the total reflection of the glass sealing member 14, and it is possible to enhance the mass production and productivity.

Although the light emitting device 1 using the phosphoric acid-based glass as the low melting point glass is explained in the first embodiment, the glass sealing member 14 may be made of other glass material. An example of such other glass materials is silicic acid-based glass (thermal expansion coefficient: $6.5\times10^{-6}/°$ C., transition point Tg: 500° C.). When the silicic acid-based glass is used, it is preferable that $Al_2O_3$ substrate (thermal expansion coefficient: $(7.0\times10^{-6}/°$ C.)) is used.

When asperities at the time of dicing are not preferable, if the dicing surface is coated with transparent resin having the same index of refraction as that of the glass sealing member 14, the asperities can be reduced.

Second Embodiment

Figure 8A:
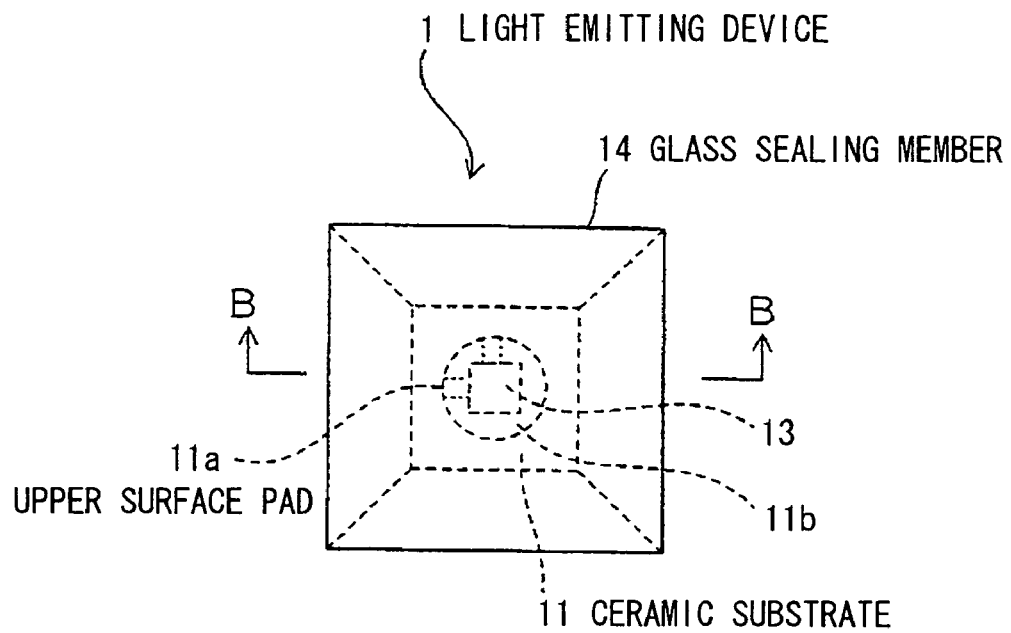
FIG. 8A is a plan view showing a light emitting device according to a second embodiment of the invention.
Figure 8B:
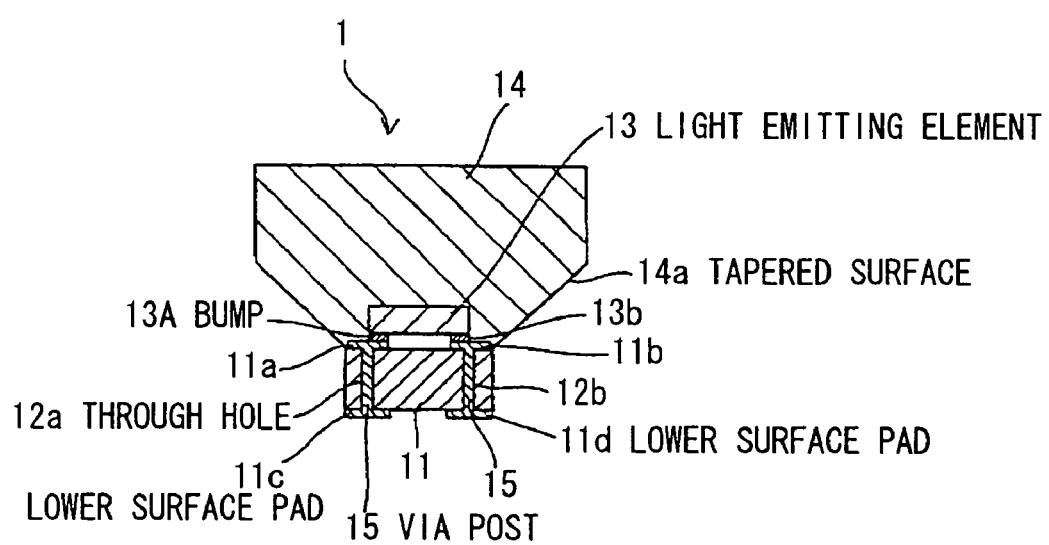
FIG. 8B is a sectional view taken along the line B-B in FIG. 8A.

FIG. 8A is a plan view showing a light emitting device according to a second embodiment of the invention, and FIG. 8B is a sectional view taken along the line B-B in FIG. 8A.

(Structure of Light Emitting Device 1)

A light emitting device 1 of the second embodiment is obtained by vertically cutting the periphery of the glass sealing member 14 and by reducing the outer shape of the glass sealing member 14 in the first embodiment. Other structures are the same as those of the first embodiment.

Figure 9:
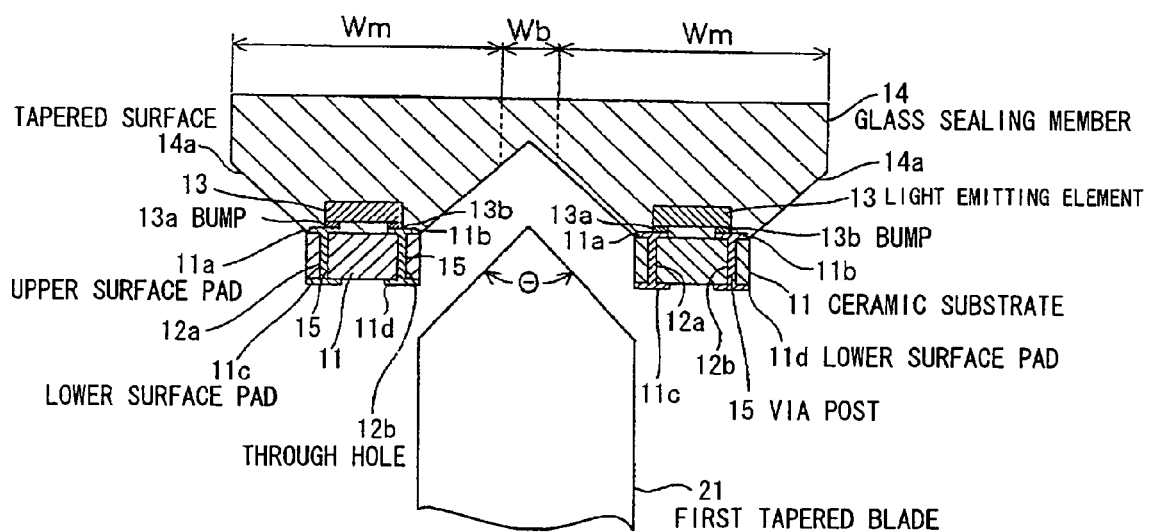
FIG. 9 is a sectional view showing a first step of a method of producing the light emitting device of the second embodiment of the invention.
Figure 10:
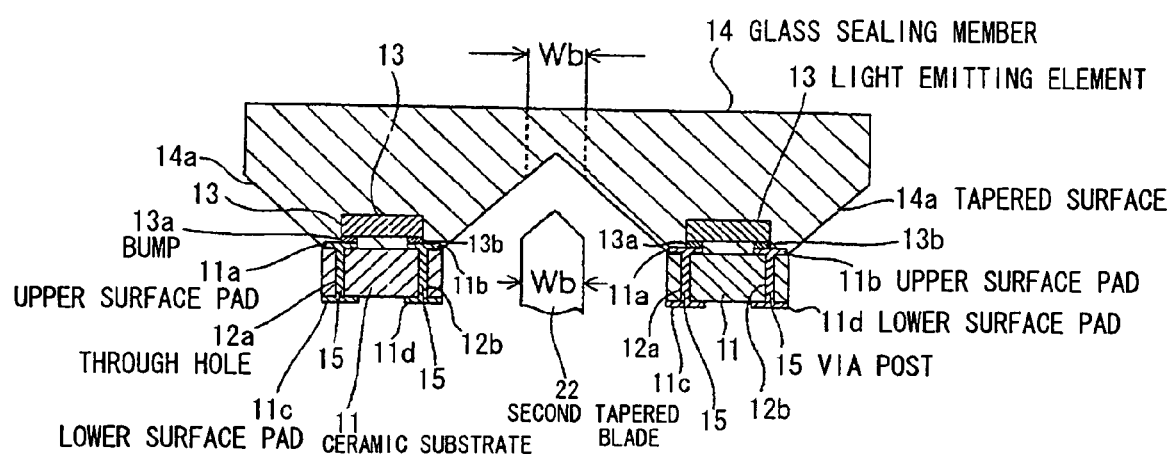
FIG. 10 is a sectional view showing a step continued from FIG. 9.
Figure 11:
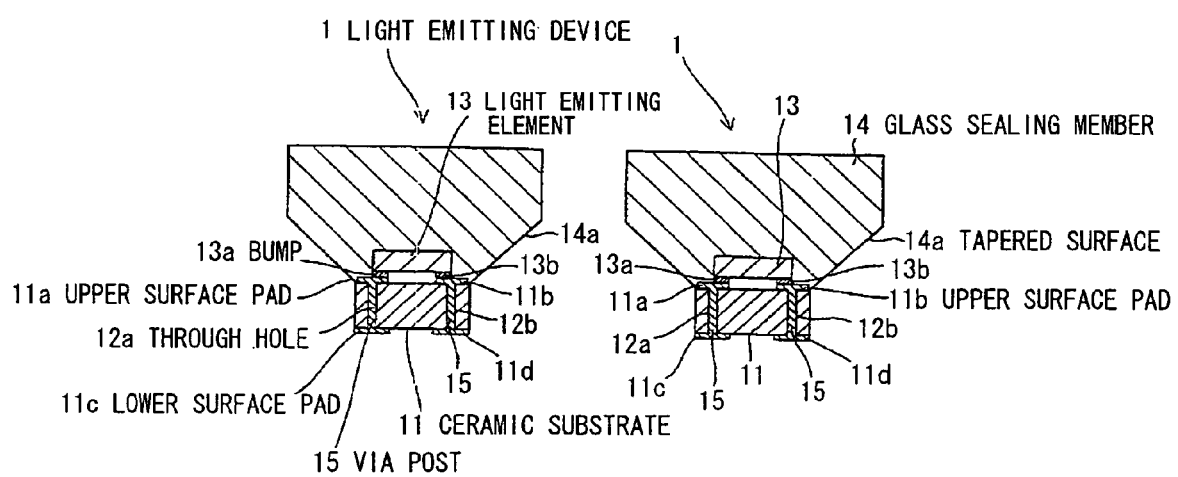
FIG. 11 is a sectional view showing a step continued from FIG. 10.

FIGS. 9 to 11 show a method of producing the light emitting device of the second embodiment of the invention. Here, a case in which the light emitting device 1 of the second embodiment is to be produced will be explained.

(Method of Producing a Light Emitting Device 1)

First, the steps required for forming the glass sealing member 14 are completed as shown in FIGS. 2 to 5 in the first embodiment. Next, as shown in FIG. 9, using a first tapered blade 21 having a cutting edge angle θ which has wide blade and which corresponds to a desired taper angle, the first tapered blade 21 is rotated and in this state, the glass sealing member 14 is moved upward to a predetermined height of the glass sealing member 14, dicing is carried out up to a halfway of the glass sealing member 14, and the tapered surface 14a is formed.

Next, as shown in FIG. 10, the tapered blade is replaced with a second tapered blade 22 having a narrower blade width than that of the first tapered blade 21. The blade width Wb of the second tapered blade 22 is set such that the blade width Wb becomes a width Wm of the glass sealing member 14 after the light emitting device 1 is completed. The cutting edge angle of the second tapered blade 22 has nothing to do with the tapered surface 14a and thus, the cutting edge angle can be set freely.

The center of the second tapered blade 22 is aligned with the center of the first tapered blade 21, and in this state, the second tapered blade 22 is moved upward while rotated, and the dicing of the glass sealing member 14 is carried out. If a barrel portion of the second tapered blade 22 penetrates the glass sealing member 14, the light emitting device 1 shown in FIG. 8 in the second embodiment is completed as shown in FIG. 11.

Effect of Second Embodiment

According to the second embodiment, since the predetermined portion of the upper portion of the tapered surface 14a is cut, the light emitting device 1 can be reduced in size in addition to the effect obtained in the first embodiment.

In the second embodiment, the outer surface of the glass sealing member 14 can be coated with a transparent film having lower index of refraction than that of the glass sealing member 14. With this, even if there is contamination of the tapered surface 14a of the glass sealing member 14, the index of refraction is not lowered and thus, the light extraction efficiency from the light emitting element 13 can be stabilized.

The light emitting element 13 is mounted on the ceramic substrate 11 as shown in FIG. 4. Then, they may be separated from each other and may be set in a glass mold and may be brought into a state shown in FIG. 9. That is, an optical surface may be formed by an upper surface flat surface forming glass mold upper mold and a lower surface tapered surface forming glass mold lower mold. Then, if they are separated from each other as shown in FIG. 10, the same shape can be obtained.

Third Embodiment

Figure 12A:
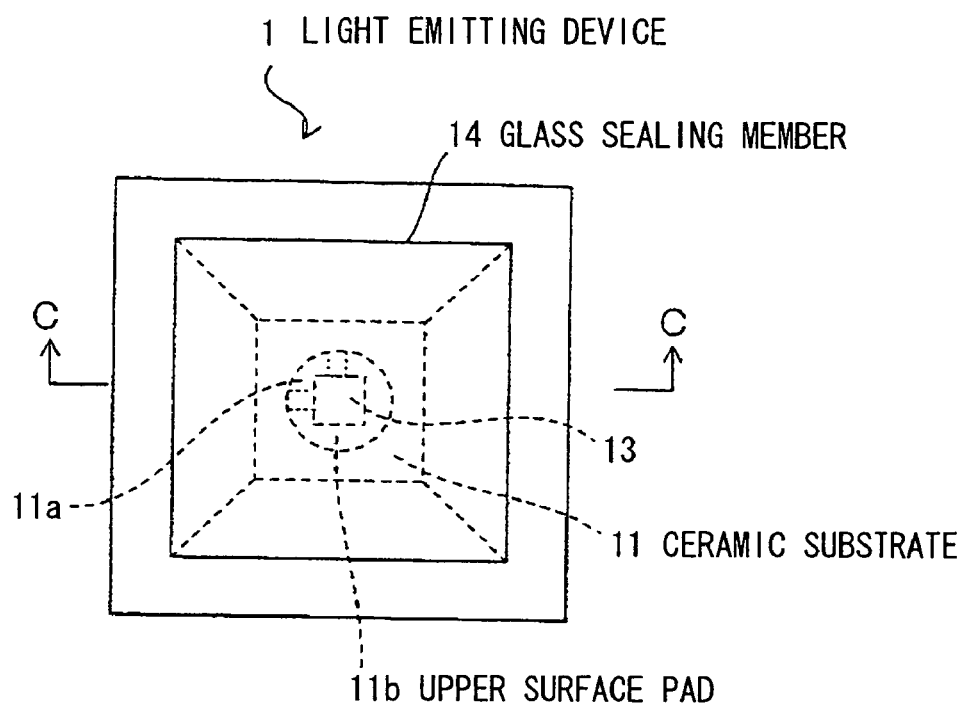
FIG. 12A is a plan view showing a light emitting device according to a third embodiment of the invention.
Figure 12B:
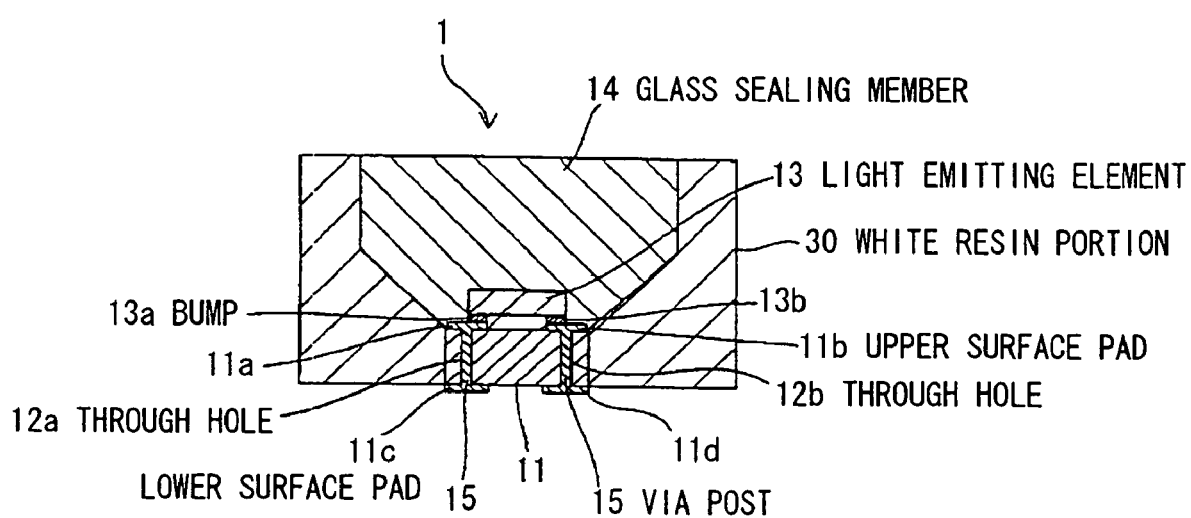
FIG. 12B is a sectional view taken along the line C-C in FIG. 12A.

FIG. 12A is a plan view showing a light emitting device according to a third embodiment of the invention, and FIG. 12B is a sectional view taken along the line C-C in FIG. 12A.

(Structure of Light Emitting Device 1)

In a light emitting device 1 of the third embodiment, in the second embodiment shown in FIG. 8, a white resin portion 30 made of white resin material is provided such as to surround a side surface of the ceramic substrate 11 and a side surface of the glass sealing member 14. Other structures are the same as those of the second embodiment If the index of refraction n of the glass sealing member 14 is 1.7, resin material having index of refraction of about 1.4 is used for the white resin portion 30. It is only necessary that the white resin portion 30 is provided on the side surface of the glass sealing member 14. The thickness of the white resin portion 30 is not limited only if the total reflection can be obtained at the interface with respect to the glass sealing member 14, and it is unnecessary to increase the thickness of the white resin portion 30 more than necessary.

Effect of Third Embodiment

According to the third embodiment, since the white resin portion 30 is provided, the same function as that obtained when the side surface of the glass sealing member 14 is provided with the reflection film can be obtained. Further, absorption of reflection of metal is not generated unlike the aluminum reflection film, blackening is not generated unlike the silver reflection film and thus, it is possible to prevent the light emitting output of the light emitting device 1 from being lowered. Other effects are the same as those of the second embodiment.

In the third embodiment, instead of providing the white resin portion 30, it is also possible to coat the side surface of the glass sealing member 14 with a transparent resin having index of refraction n of 1.4, and the surface of the transparent resin coat with white resin coat having index of refraction n of 1.5. With this, the effect of total reflection generated by coating of n=1.4 can partially be obtained, and even when it is used in an environment which is easily affected by dusts existing in its periphery, the characteristics are not easily be changed, the thickness of the white resin portion 30 can be ignored, and the device can be reduced in size.

The coating is not limited to the white resin coating, and if the index of refraction is high with respect to the light emitting wavelength, other colors may be employed, and ceramic coating may be employed.

Fourth Embodiment

Figure 13A:
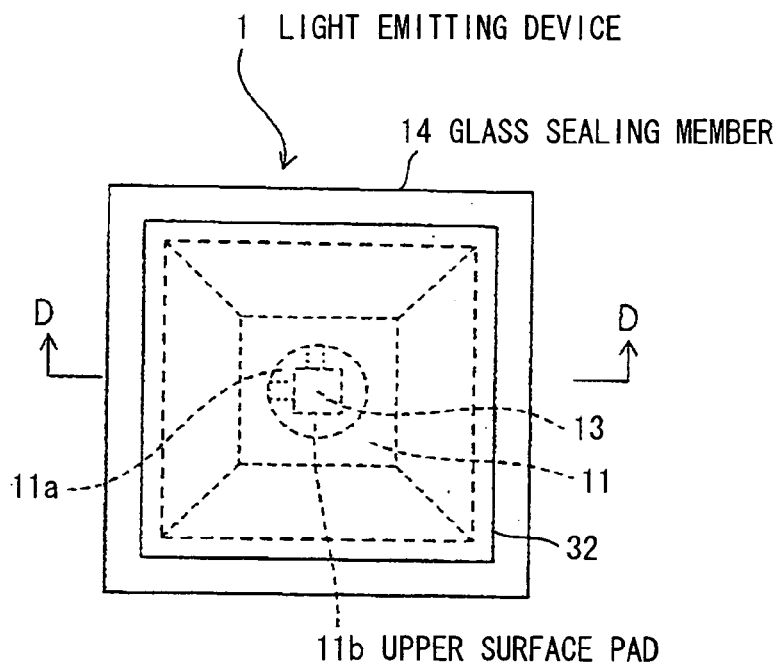
FIG. 13A is a plan view showing a light emitting device according to a fourth embodiment of the invention.
Figure 13B:
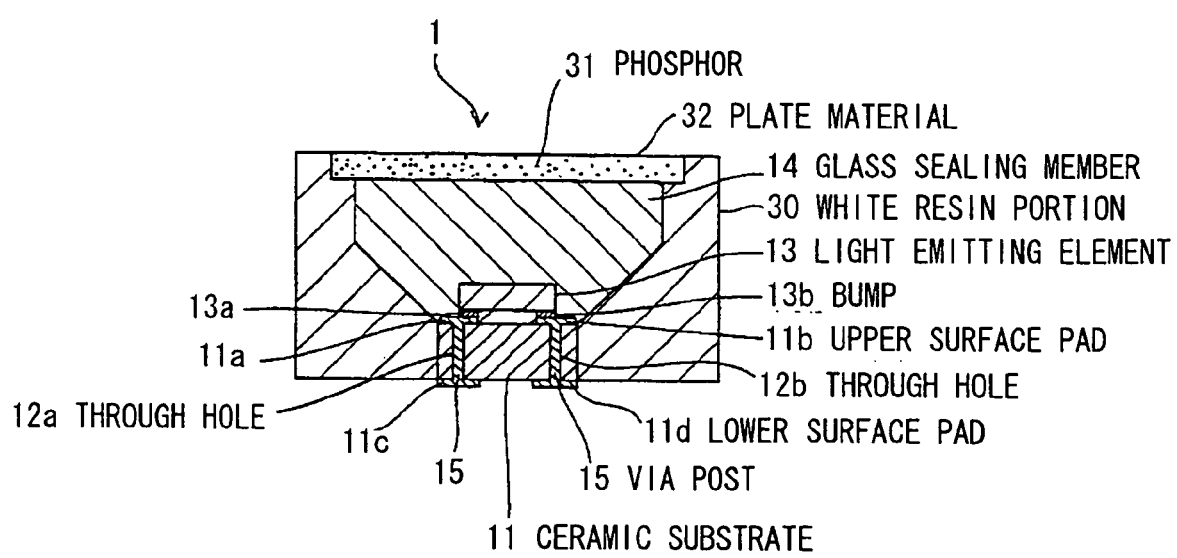
FIG. 13B is a sectional view taken along the line D-D in FIG. 13A.

FIG. 13A is a plan view showing a light emitting device according to a fourth embodiment of the invention, and FIG. 13B is a sectional view taken along the line D-D in FIG. 13A.

(Structure of Light Emitting Device 1)

According to a light emitting device 1 of this embodiment, in the third embodiment shown in FIG. 12, the glass sealing member 14 is provided at its upper surface with a plate material 32 including phosphor 31 provided on a transparent glass or resin. Other structures are the same as those of the third embodiment.

It is possible to use YAG phosphor, silicate phosphor, or a mixture thereof in a predetermined rate as the phosphor 31.

Effect of Fourth Embodiment

According to the fourth embodiment, the glass sealing member 14 is provided at its upper surface with the plate material 32 including the phosphor 31. Thus, wavelength with respect to light from the light emitting element 13 can be converted and thus, spectrum characteristics having high freedom degree can be obtained. Other effects are the same as those of the third embodiment.

In the fourth embodiment, instead of using the plate material 32 including the phosphor 31, a filter which cuts ultraviolet rays may be used or may be superposed on the plate material 32. The plate material 32 may not be provided, and the glass sealing member 14 may include a phosphor.

Fifth Embodiment

Figure 14A:
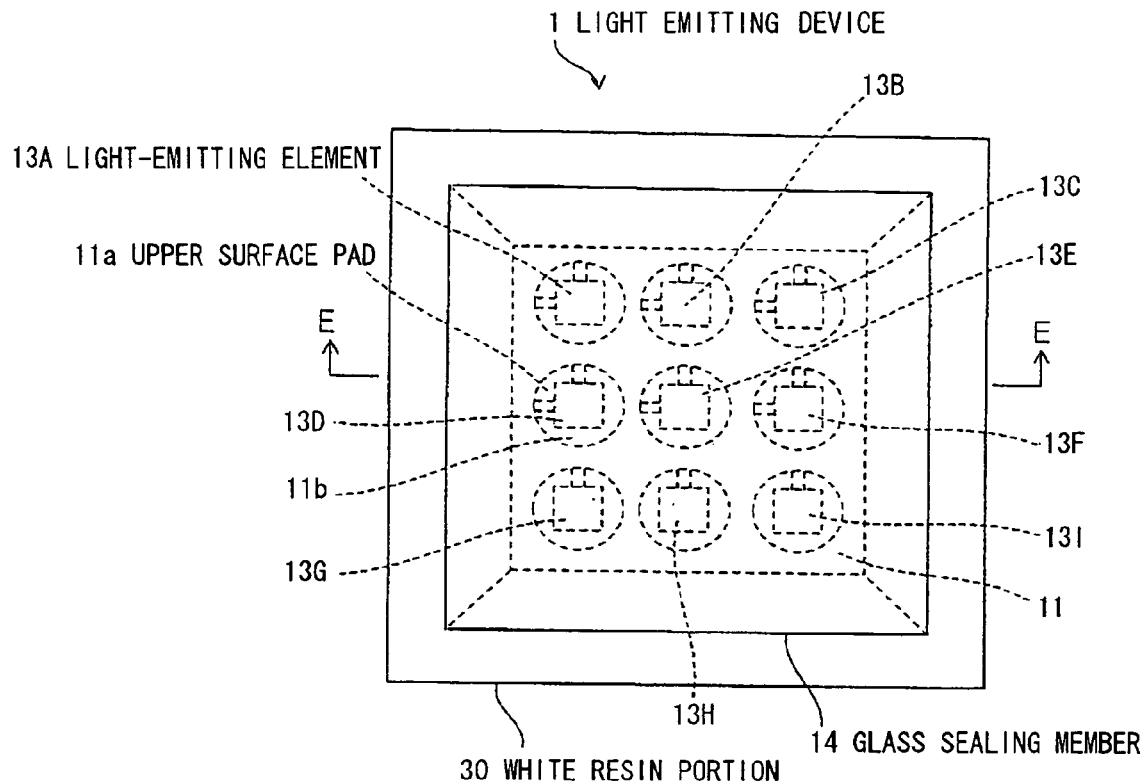
FIG. 14A is a plan view showing a light emitting device according to a fifth embodiment of the invention.
Figure 14B:
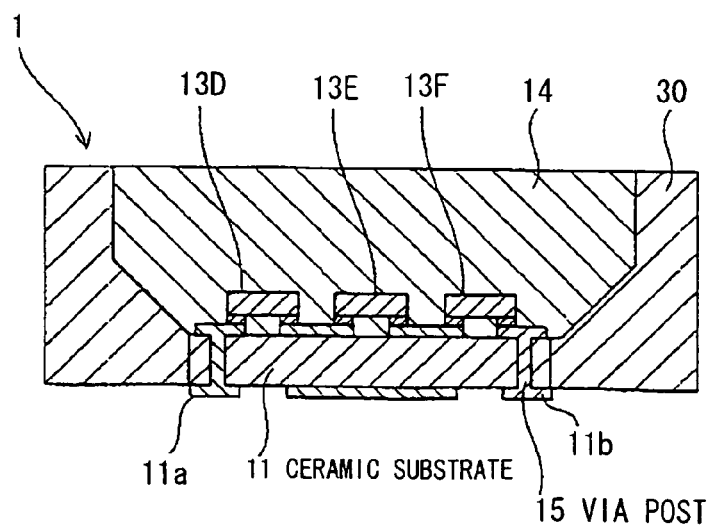
FIG. 14B is a sectional view taken along the line E-E in FIG. 14A.

FIG. 14A is a plan view showing a light emitting device according to a fifth embodiment of the invention, and FIG. 14B is a sectional view taken along the line E-E in FIG. 14A.

(Structure of Light Emitting Device 1)

According to a light emitting device 1 of this embodiment, in the third embodiment shown in FIG. 12, a plurality of light emitting elements 13A to 13I are mounted, the number and disposition of pads are changed in accordance with connection states of the elements, and a multi-light emitting type is established. The ceramic substrate 11 electrically connects the plurality of light emitting elements 13A to 13I by wiring patterns in a layer (not shown). Other structures are the same as those of the fifth embodiment.

The light emitting elements 13A to 13I may be of the same color or a combination of R (red), G (green) and B (blue). Although the number of light emitting elements is nine, the number is not limited. It is also possible to individually drive the light emitting elements 13A to 13I, three serially arranged light emitting elements may be connected in parallel, or nine light emitting elements may be connected serially.

Effect of Fifth Embodiment

According to the fifth embodiment, arbitrary number of light emitting elements can be mounted only by increasing the glass sealing member 14 in size, the light emitting output can easily be increased, and the output of the light emitting device 1 can be increased. It is possible to easily obtain light emission of mixed color and white light by combining a plurality of light emitting elements having different light emission colors.

Another Embodiment

The present invention is not limited to the above-described embodiments, and the invention can variously be modified within a range not departing from its subject matter. For example, in any of the embodiments except the fourth embodiment, a plate material 32 including the phosphor 31 may be provided, or the glass sealing member 14 may include the phosphor 31. The multi-light emitting structure shown in the fifth embodiment can also be applied to the first, second and fourth embodiments.

The electricity supply portion has been explained as a ceramic substrate 11 formed with the circuit pattern, but a metal lead may also be used. Since the lead projects, this deteriorates the compact design, but since a glass which is harder than resin sealing is used, even if the device is reduced in size, strength required for maintaining the lead can be secured.

Although the sealing material of the LED element 2 has been explained as a glass, a glass whose portion is crystallized and whitish may be also used depending on its application, and the material is not limited to a glass only if the material is an inorganic material which is chemically stable and which can excellently be bonded to an electricity receiving portion.

Sixth Embodiment

Figure 16:
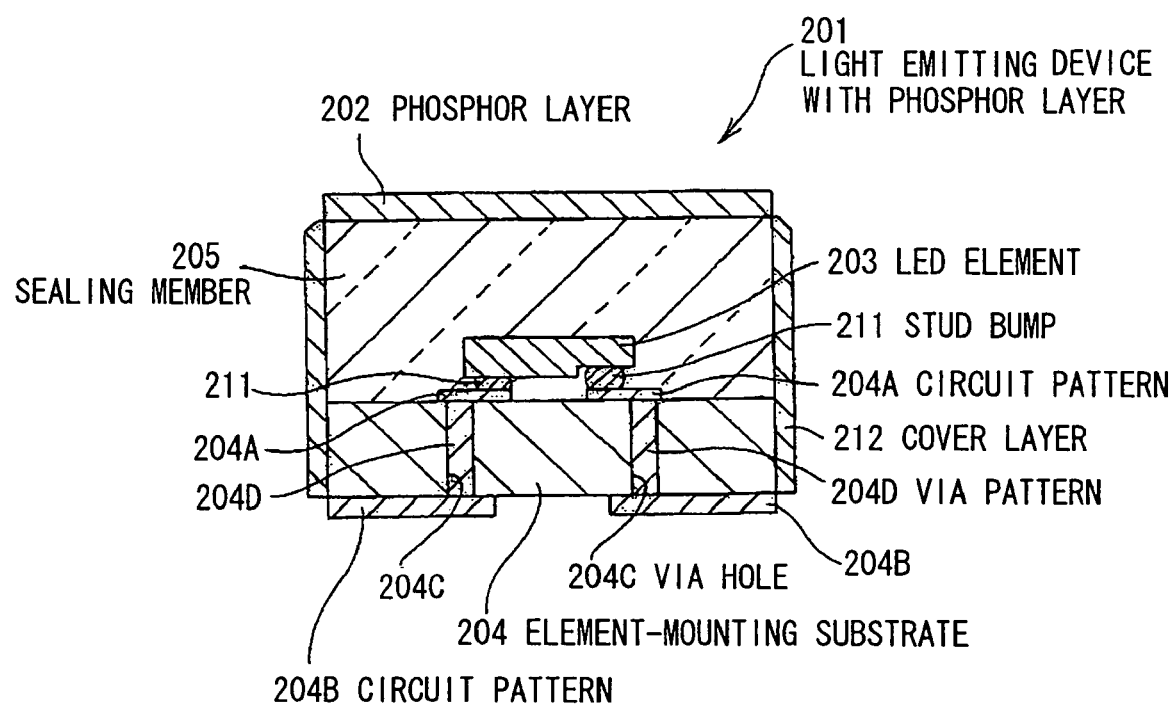
FIG. 16 is a sectional view showing a light emitting device having a phosphor layer according to a sixth embodiment of the invention.
Figure 17:
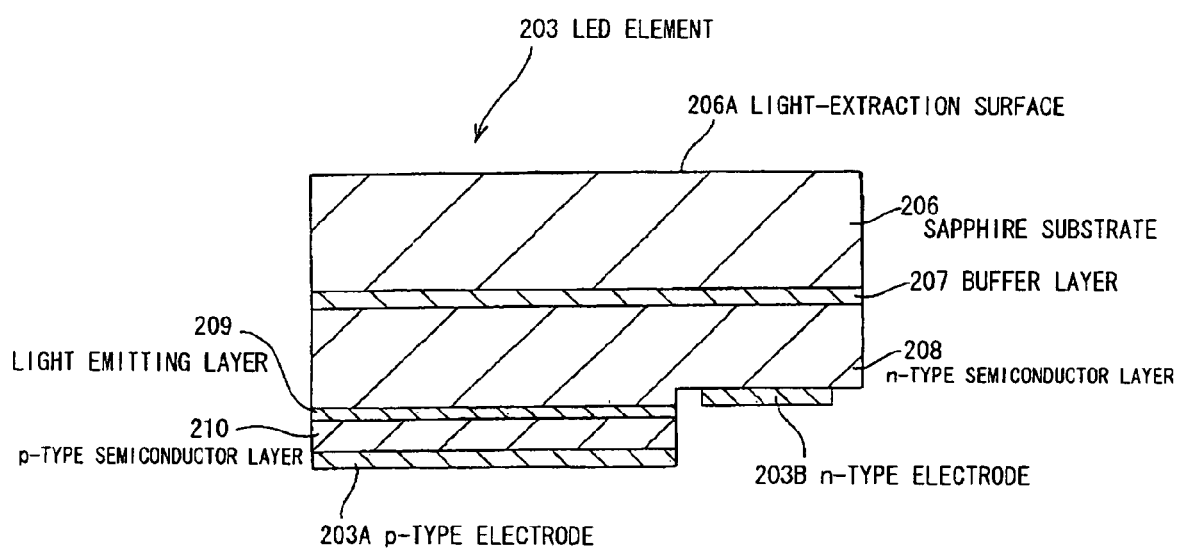
FIG. 17 is a sectional view showing an LED element shown in FIG. 16.

FIG. 16 is a sectional view showing a light emitting device having a phosphor layer according to a sixth embodiment of the invention, and FIG. 17 is a sectional view showing an LED element shown in FIG. 16.

[Entire Structure of Light Emitting Device having Phosphor Layer]

In FIG. 16, a light emitting device 201 having a phosphor layer includes an LED element 203 provided at its light extracting side with a phosphor layer 202, an element-mounting substrate 204 on which the LED element 203 is mounted, and a sealing member 205 for sealing the LED element 203 on the element-mounting substrate 204. The entire light emitting device having phosphor layer has substantially regular hexahedron shape (e.g., a vertical size, a lateral size and a height size thereof are 1 mm)

(Structure of LED Element 203)

As shown in FIG. 17, the LED element 203 comprises a flip chip type blue LED element having a p-type electrode 203A and an n-type electrode 203B. The LED element 203 is formed by sequentially crystal growing a buffer (AlN) layer 207, an n-type semiconductor (GaN) layer 208, a light emitting layer 209 and a p-type semiconductor (GaN) layer 210 on a sapphire ($Al_2O_3$) substrate 206. The LED element 203 is connected an element-mounting portion of a circuit pattern 204A (later-described) of the element-mounting substrate 204 through a stud bump 211. The thermal expansion coefficient α of the LED element 203 is set to $7 \times 10^{-6}/°$ C. The p-type electrode 203A is made of rhodium (Rh), and is disposed on a surface of a p-type semiconductor layer 210. The n-type electrode 203B is made of aluminum (Al) and is disposed on an outer exposed surface of the n-type semiconductor layer 208.

(Structure of Element-Mounting Substrate 204)

The element-mounting substrate 204 is a ceramic substrate ($Al_2O_3$ substrate) having a substantially square plane. The element-mounting substrate 204 is provided at its front and back surfaces with circuit patterns 204A and 204B. The thermal expansion coefficient α of the element-mounting substrate 204 is set to $7 \times 10^{-6}/°$ C. As shown in FIG. 16, the element-mounting substrate 204 is provided with a via hole 204C which is opened toward the circuit patterns 204A and 204B (front and back surfaces). A via pattern 204D made of tungsten (W) and connected to both the circuit patterns 204A and 204B is formed in the via hole 204C.

(Structure of sealing member 205)

The entire sealing member 205 is made of, for example, $SiO_2$—$Nb_2O_5$-based low melting point glass (index of refraction n=1.8). As described above, the sealing member 205 seals the LED element 203. The thermal expansion coefficient α of the sealing member 206 is set to $7 \times 10^{-6}/°$ C. The light emitting surface of the sealing member 204 is formed with a phosphor layer 202 such as YAG (Yttrium Aluminum Garnet) or the like which emits yellow wavelength conversion light when the light emitting surface receives radiation light (blue light) radiated from the LED element 203 and is excited. The sealing member 205 is formed with a polygonal cylindrical cover layer 212 of reflection layer which covers the portions except the light emitting surface and element-mounting substrate side surface, and receives radiation light from the LED element 203 and reflects the same toward the phosphor layer. An example of material of the cover layer 212 is a pigment-based white paint.

[Operation of Light Emitting Device 201]

If voltage is applied to the light emitting device 201 from a power supply, the LED element 203 emits light in the light emitting layer 209, and the radiation light is emitted into the sealing member 205. Next, first radiation light of the radiation light enters the phosphor layer 202 from the sealing member 205. Further, second radiation light enters the cover layer 212 and is reflected, and then enters the phosphor layer 202. In this case, the phosphor layer 202 receives radiation light (blue light) emitted from the LED element 203 and is excited, and emits yellow wavelength conversion light. Therefore, blue radiation light emitted from the LED element 203 and yellow wavelength conversion light emitted from the phosphor layer 202 are mixed and become white light. Then, the white light is emitted from the phosphor layer 202 toward the subject to be illuminated.

Figure 18:
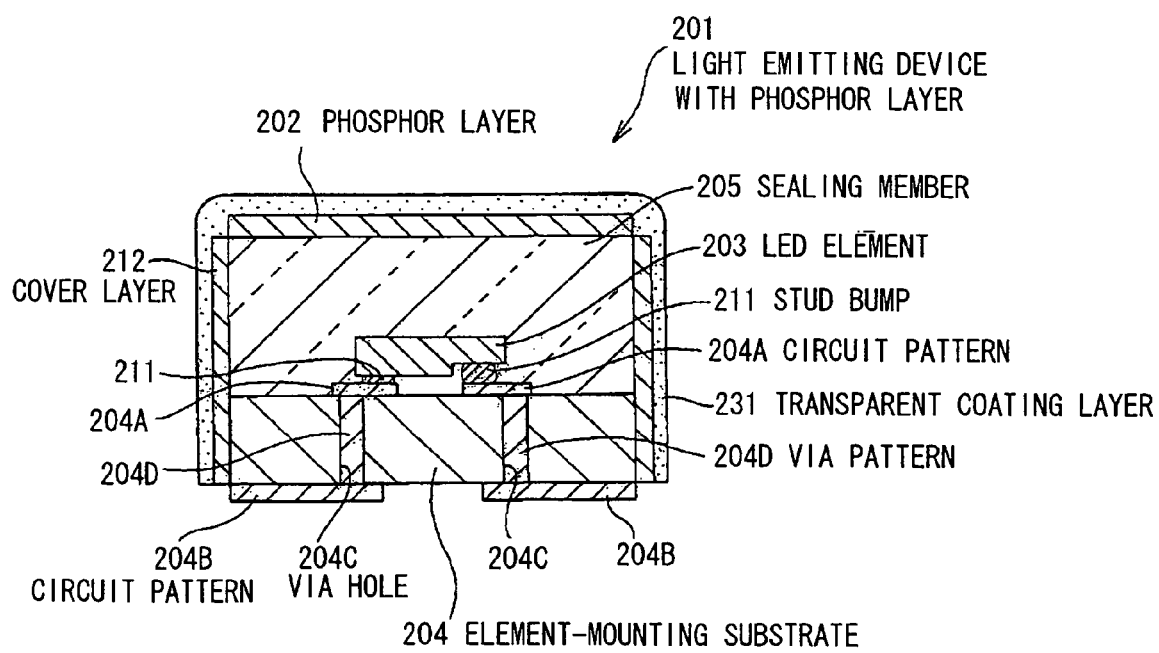
FIG. 18 is a sectional view showing a modification of the sixth embodiment.

In this embodiment, the cover layer 212 and the phosphor layer 202 are exposed outside, but the invention is not limited to the embodiment. As shown in FIG. 18, the outer surface of the cover layer 212 and the light emitting surface of the phosphor layer 202 may be coated with a transparent coating film 231 made of PMMA (polymethyl methacrylate) resin.

Next, a method of producing the light emitting device having phosphor layer of the sixth embodiment will be explained using FIGS. 19A to 19F.

[Method of Producing a Light Emitting Device 201 Having Phosphor Layer]

Figure 19A:
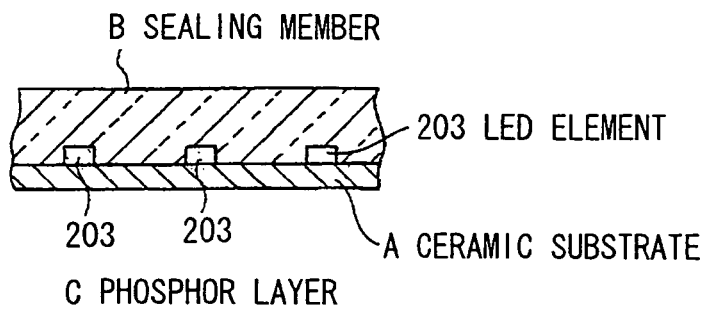
FIGS. 19A to 19F are sectional views of a method of producing the light emitting device of the sixth embodiment.
Figure 19B:
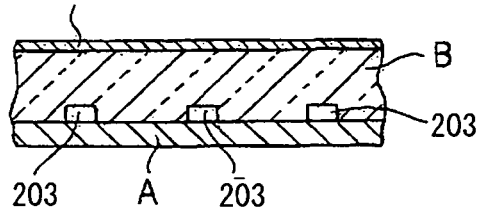
Figure 19C:
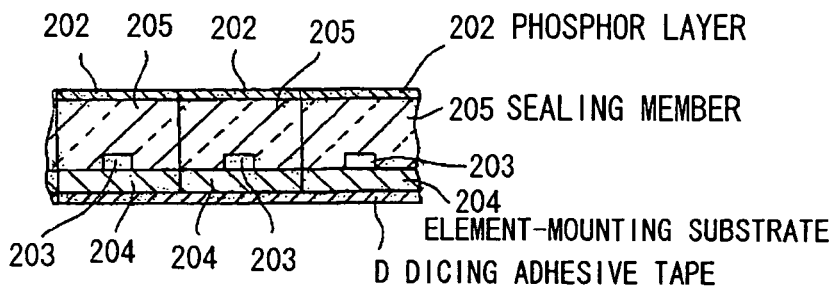
Figure 19D:
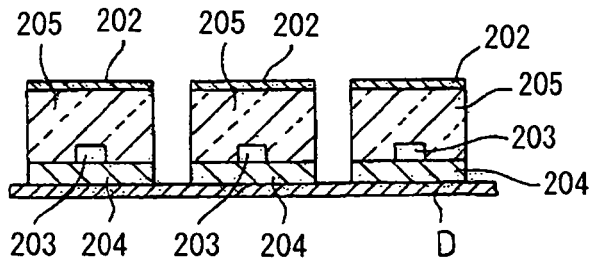
Figure 19E:
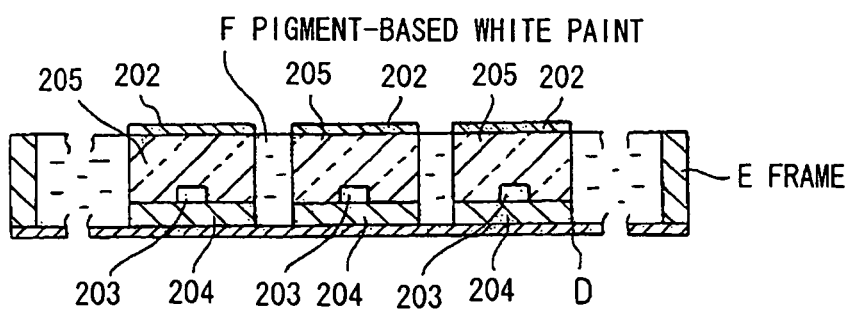
Figure 19F:
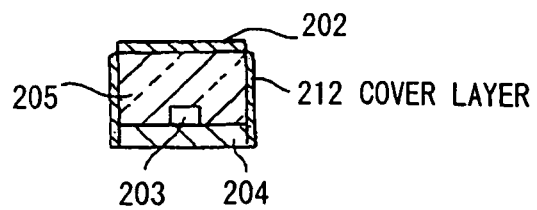

FIGS. 19A to 19F are sectional views of the method of producing the light emitting device having phosphor layer of the sixth embodiment. FIG. 19 are sectional views, where in FIG. 19A shows a glass sealing step of the LED element, FIG. 19B shows a forming step of the phosphor layer, FIG. 19C shows a forming (dicing) step of the LED element having the phosphor layer, FIG. 19D shows an expansion step, FIG. 19E shows an immersing step of the LED element having the phosphor layer, and FIG. 19F shows a forming step of the cover layer.

According to the method of producing the light emitting device shown in this embodiment, "glass sealing step of LED element", "forming step of phosphor layer", "dicing step", "expanding step", "immersing step of LED element having phosphor layer" and "forming step of cover layer" are sequentially carried out. These steps will be explained.

"Glass Sealing Step of LED Element"

First, first patterns (not shown) which become circuit patterns 204A and 204B (shown in FIG. 16), and second patterns (not shown) which become the via pattern 204D connected to the first patterns are formed on a ceramic ($Al_2O_3$) substrate (element-mounting substrate). On the ceramic substrate, LED elements 203 are mounted on a plurality of element-mounting portions which are arranged in vertical and lateral directions at predetermined distances from one another. In this case, if the LED element 203 is mounted on each mounting portion on the ceramic substrate, the plurality of LED elements 203 are arranged on the ceramic substrate in the vertical and lateral directions at predetermined distances from one another.

Next, a plate-like low melting point glass ($SiO_2$—$Nb_2O_5$-based low melting point glass) is disposed in parallel on the element-mounting surface of the ceramic substrate on which the plurality of LED elements 203 are mounted, it is subjected to hot press working at a temperature of 500° C. in the nitrogen atmosphere and then, it is cooled. In this case, if the low melting point glass is cooled, as shown in FIG. 19A, the plurality of LED elements 203 on a ceramic substrate A are sealed by a sealing member B.

"Forming Step of Phosphor Layer"

A synthetic resin material including phosphor such as YAG (Yttrium Aluminum Garnet) is screen printed on the sealing member B on its side opposite from the ceramic substrate. In this case, if the synthetic resin material including the phosphor is screen printed on the sealing member B, as shown in FIG. 19B, a phosphor layer C is formed on the sealing member B on its side opposite from the element-mounting substrate.

"Dicing Step"

First, in the "forming step of phosphor layer", the LED element 203 having the phosphor layer C formed on the sealing member B is pasted on a dicing adhesive tape together with the ceramic substrate A.

Next, the ceramic substrate A, the sealing member B and the phosphor layer C on the dicing adhesive tape are cut by a dicer in accordance with the number of LED elements 203. In this case, if the ceramic substrate A, the sealing member B and the phosphor layer C are cut, as shown in FIG. 19C, a plurality of LED elements 203 having phosphor layers 202 sealed with the sealing member 205 on the element-mounting substrate 204 is formed on a dicing adhesive tape D.

"Expanding Step"

The dicing adhesive tape D is heated and expanded in the arrangement (vertical and lateral directions) directions of the LED elements 203. In this case, if the dicing adhesive tape D is expanded, as shown in FIG. 19D, the plurality of LED elements 203 are arranged side-by-side at predetermined distances from one another on the dicing adhesive tape D.

"Immersing Step of LED Element Having Phosphor Layer"

First, in the "expanding step", a frame for storing paint is disposed on the dicing adhesive tape D on which the plurality of LED elements 203 is arranged at the predetermined distances from one another. In this case, if the frame is disposed on the dicing adhesive tape D, the plurality of LED elements 203 is accommodated in the frame at the predetermined distances from one another in a state in which the light emitting surface of the sealing member 205 and portions of the sealing member 205 except its light emitting surface and end surface on the side of the element-mounting substrate are exposed outside.

Next, a predetermined amount of pigment-based white paint which is material of the reflection layer is stored in the frame. In this case, as shown in FIG. 19E, if the predetermined amount of pigment-based white paint F is stored in the frame, all of the exposed portions of the sealing member 205 (portions of the sealing member 205 except its light emitting surface and end surface on the side of the element-mounting substrate) in the LED element 203 are immersed.

"Forming Step of Cover Layer"

First, the frame is removed (separated) from the dicing adhesive tape D. In this case, if a frame E is removed, a pigment-based white paint F is applied to the entire region of the sealing member 205 except the light emitting surface and the end surface of the element-mounting substrate.

Next, the pigment-based white paint F applied to the sealing member 205 is dried and then, the dicing adhesive tape D is removed from each element-mounting substrate 204. In this case, if the dicing adhesive tape D is removed, as shown in FIG. 19F, the entire region of the sealing member 205 in each LED element 203 except the light emitting surface and the end surface of the element-mounting substrate is covered with the cover layer 212.

In this manner, the light emitting device 201 having the phosphor layer can be produced.

Figure 20:
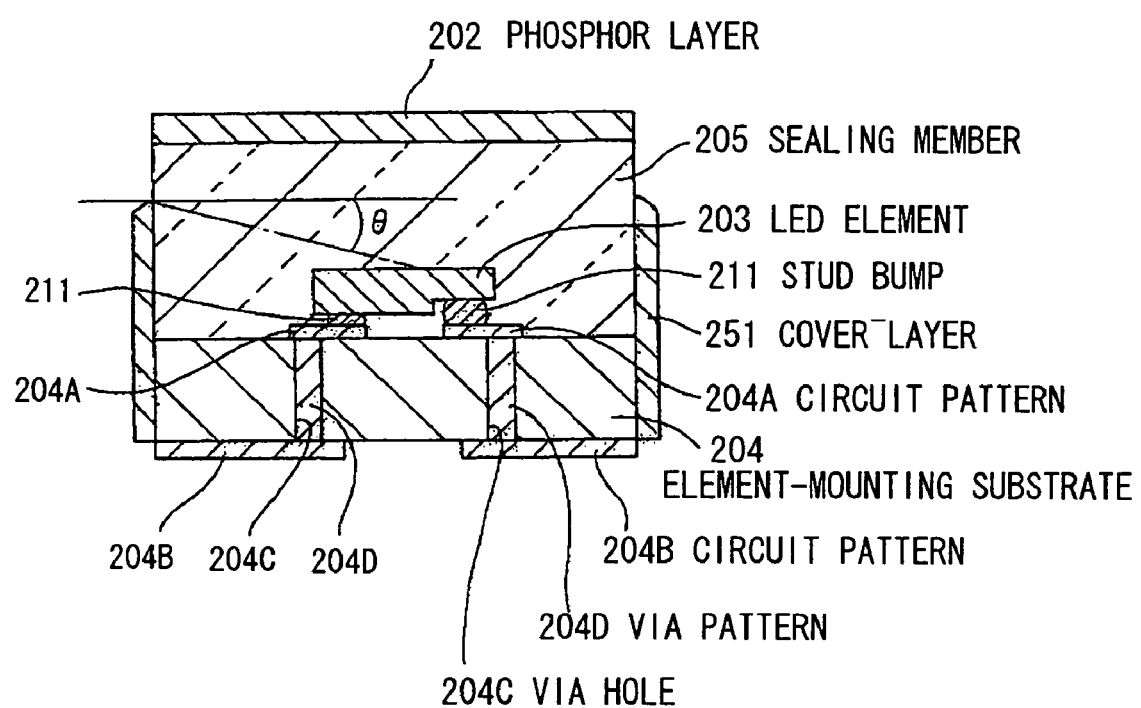
FIG. 20 is a sectional view showing a modification of the producing method of the sixth embodiment.

In this embodiment, the entire region of the sealing member 205 except the light emitting surface and the end surface on the side of the element-mounting substrate is covered with the cover layer 212. The present invention is not limited to this, and a portion of the sealing member 205 may be covered with a cover layer 251 in a state in which a portion of the sealing member 205 on the side of the phosphor layer is exposed outside as shown in FIG. 20. In this case, the boundary portion between the portion of the cover layer 251 on the side of the phosphor layer and the exposed portion of the sealing member 205 is disposed in a position where radiation light from the LED element 203 enters at a critical angle θ. With this, if the radiation light from the LED element 203 enters the interface between air and the exposed portion of the sealing member 205, since the light is totally reflected, the light does not leak outside from the exposed portion of the sealing member 205.

The p-type electrode 203A of the LED element is not limited to rhodium, and a transparent conductive oxide such as ITO may be used. The ITO has great adhesion with respect to the semiconductor layer, and has the same thermal expansion coefficient as that of the LED element, thus the electrode is not peeled off easily even in the glass sealing working at a high temperature, stable characteristics and yield at the time of mass production can be maintained at high level.

Effect of Sixth Embodiment

According to the sixth embodiment explained above, the following effects can be obtained.

(1) The LED element 203 is sealed by the sealing member 205 made of glass, and the phosphor layer 202 is formed on the light emitting surface of the sealing member 205. Thus, the sealing member 205 is not deteriorated by heat generated by the light emission of the LED element 203 and thus, deterioration of the transparency of the sealing member 205 can be prevented, and the irradiation light having high brightness can be obtained for a long term.

(2) Since the phosphor is not located in the vicinity of the LED element 203, this is advantageous thermally and optically. That is, when the LED element 203 is driven with high current, the LED element 203 is heated to a high temperature of 100° C. or higher, but since the phosphor is away from the LED element 203, the phosphor does not receive the thermal influence directly. Thus, the initial characteristics and characteristics with time are not affected easily. If the phosphor is located in the vicinity of the LED element 20, light reflected on the surface of the phosphor and light which is converted in wavelength and excited by the phosphor enters the LED element 203 again, the probability that the light is absorbed in the element is increased, and the light emitting efficiency is deteriorated. According to the present invention, however, since the phosphor is away from the LED element 203, the probability of re-enter of light into the LED element 203 is reduced and thus, the light emitting efficiency can be enhanced.

(3) The film thickness of the layer including the phosphor can precisely be controlled by the screen printing. Since all light emitted from the light emitting surface is radiated outward through the layer including the phosphor, tone can be controlled precisely. A human's color sensitivity is especially high in the white region, high precision control is required, and this requirement can be satisfied with excellent mass productivity. In the case of resin sealed LED, after a frame for charging the sealing material is formed, the resin sealing is carried out generally. In the case of glass sealed LED, it is unnecessary to form the frame due to the producing method. However, to carry out high precision control, the cover layer 212 which becomes the side surface reflection surface is provided.

(4) The radiation light emitted from the LED element 203 is emitted from the light emitting surface of the phosphor layer 202 through the sealing member 205 in the cover layer 212. Thus, the radiation light from the LED element 203 is not emitted with wide angle unlike the conventional technique, and desired luminous intensity distribution characteristics can be obtained.

Seventh Embodiment

Figure 21A:
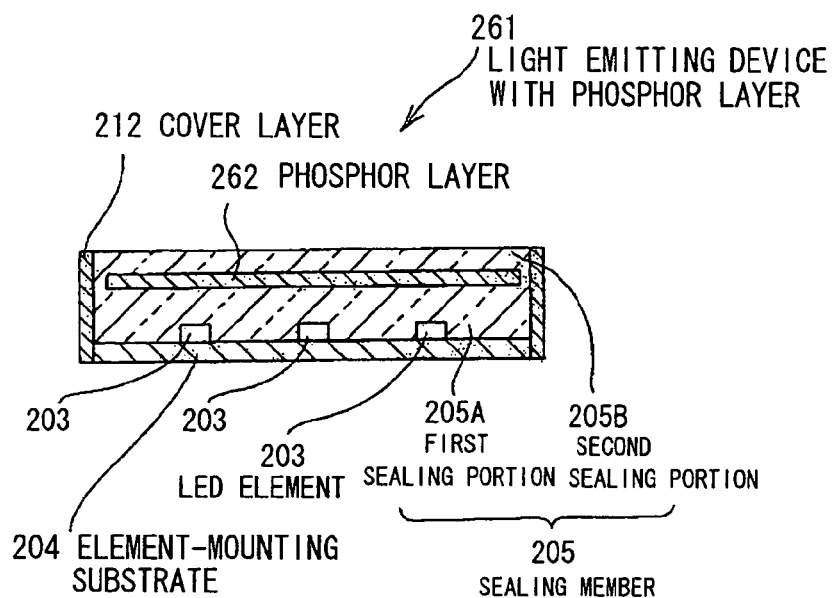
FIGS. 21A and 21B are a sectional view and a plan view showing a light emitting device having a phosphor layer according to a seventh embodiment of the invention.
Figure 21B:
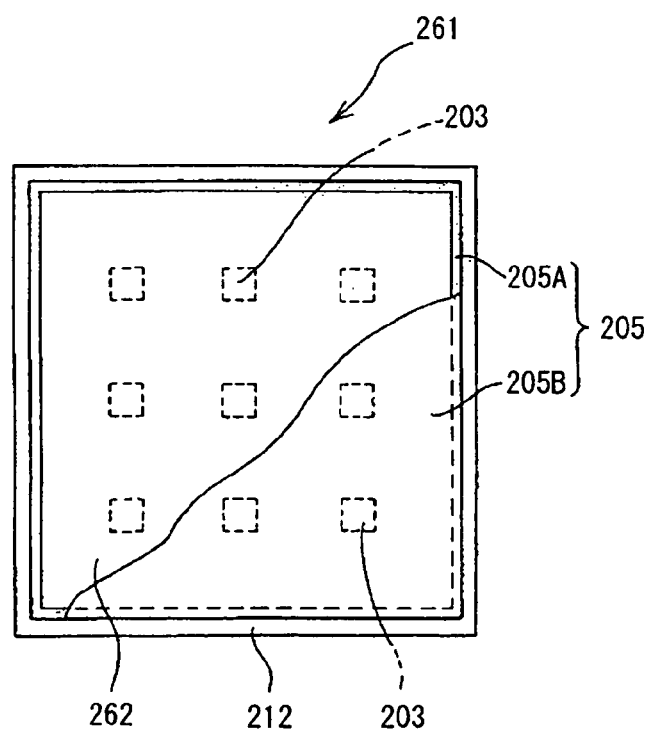

FIGS. 21A and 21B are a sectional view and a plan view showing a light emitting device having a phosphor layer according to a seventh embodiment of the invention. In FIGS. 21A and 21B, the same members as those shown in FIG. 16 are designated with the same symbols, and the detailed explanation thereof will be omitted.

As shown in FIGS. 21A and 21B, a light emitting device 261 having a phosphor layer shown in the seventh embodiment is characterized in that a phosphor layer 262 is disposed in the sealing member 205.

Therefore, the sealing member 205 includes a first sealing portion 205A for sealing the LED element 203 and a second sealing portion 205B on which the phosphor layer 262 is screen printed. Both the sealing portions 205A and 205B are bonded to each other through the phosphor layer 262. In this case, in order to bond the first sealing portion 205A and the second sealing portion 205B to each other, a size of a flat surface of the phosphor layer 262 is set smaller than flat surface sizes of both the sealing portions 205A and 205B. The plurality of LED elements 203 is disposed in the sealing member 205 side-by-side in the vertical and lateral directions on the plane.

Effect of Seventh Embodiment

According to the above-explained seventh embodiment, the following effects can be obtained in addition to the effects (1) and (2) of the sixth embodiment.

Since the plurality of LED elements 203 is disposed in the sealing member 205 side-by-side in the vertical and lateral directions on the plane, brightness can be enhanced to satisfy the requirement of recent years. Although the phosphor layer 262 is not formed up to the end because upper and lower glasses for sandwiching the phosphor layer are adhered to each other, but they may be adhered to each other or held, and the phosphor layer 262 may be formed up to the end.

Eighth Embodiment

Figure 22:
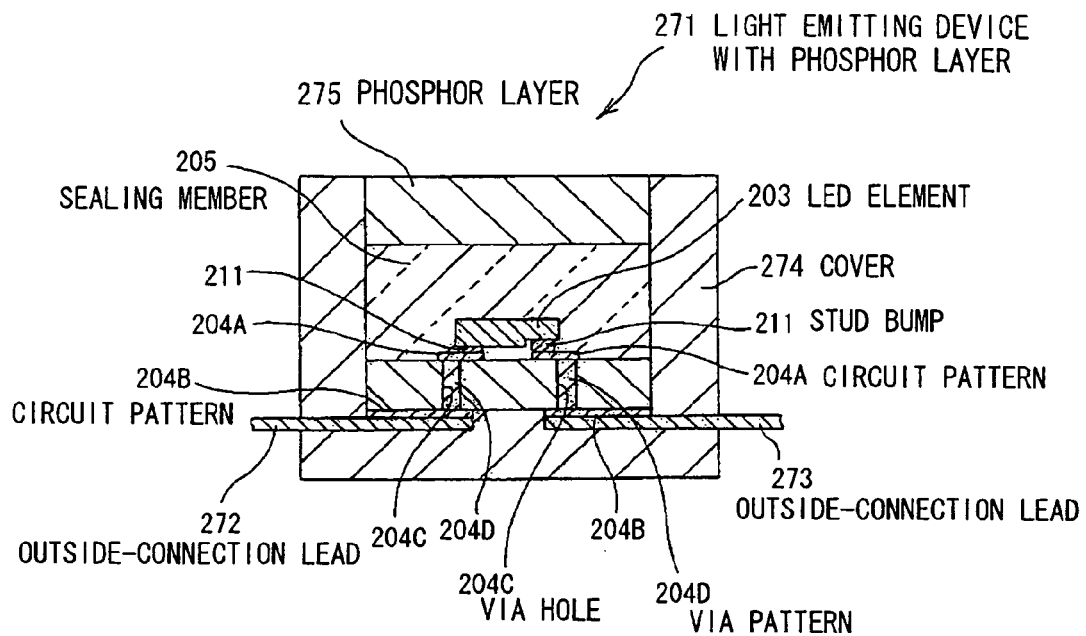
FIG. 22 is a sectional view showing a light emitting device having a phosphor layer according to an eighth embodiment of the invention.

FIG. 22 is a sectional view showing a light emitting device having a phosphor layer according to an eighth embodiment of the invention. In FIG. 22, the same members as those shown in FIG. 16 are designated with the same symbols, and the detailed explanation thereof will be omitted.

As shown in FIG. 22, a light emitting device 271 having a phosphor layer shown in the eighth embodiment is characterized in that a cover which becomes a side surface reflection surface having a pair of outside-connection leads 272 and 273 is formed as a reflection frame.

Thus, portions of the pair of outside-connection leads 272 and 273 are embedded in a bottomed polygonal cylindrical cover 274 made of high polymer such as white nylon by insert molding, and the entire outside-connection leads 272 and 273 are formed by cutting (bending) the lead frame made of copper (Cu). One ends of the leads 272 and 273 are connected to the p-type electrode 203A and the n-type electrode 203B (LED element 203) through the circuit patterns 204A and 204B, and the via pattern 204D, respectively, and the other ends are exposed to outside. The LED element 203 is sealed with the sealing member 205 and accommodated in the cover 274. On the light emitting surface of the sealing member 205, a phosphor layer 275 located in the cover 274 and including phosphor particles such as YAG (Yttrium Aluminum Garnet) is formed in a transparent resin made of PMMA (polymethyl methacrylate) resin. The phosphor layer 275 and the cover 274 are formed using two colors.

Effect of Eighth Embodiment

According to the eighth embodiment, the following effect can be obtained in addition to the effects (1) and (2) of the sixth embodiment.

Since the cover 274 is made of white nylon, excellent forming working ability of the cover 274 can be obtained, and it is possible to reduce the working cost.

Ninth Embodiment

Figure 23:
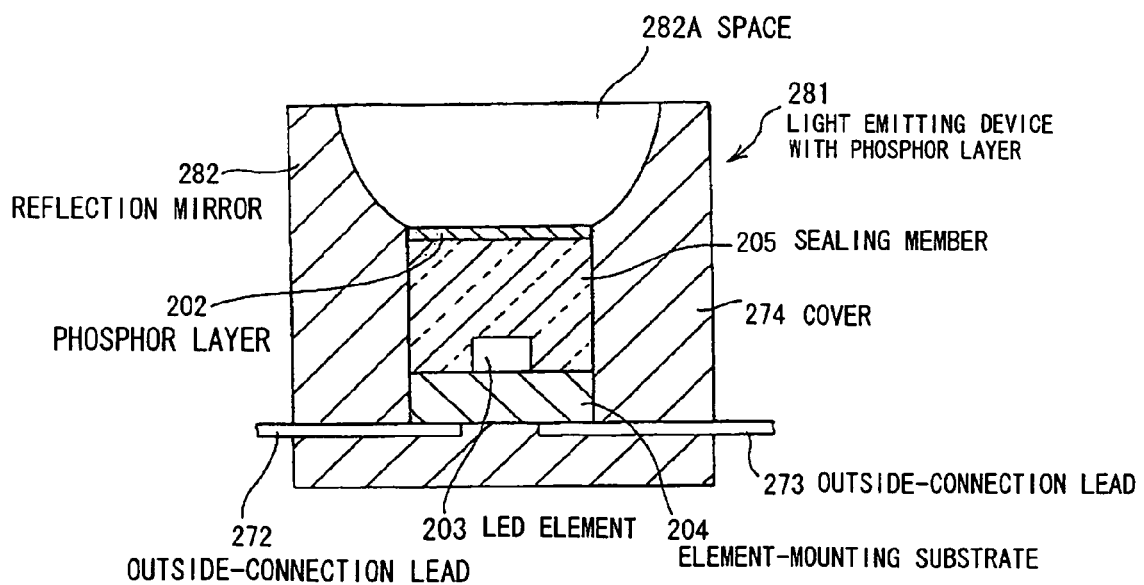
FIG. 23 is a sectional view showing a light emitting device having a phosphor layer according to a ninth embodiment of the invention.

FIG. 23 is a sectional view showing a light emitting device having a phosphor layer according to a ninth embodiment of the invention. In FIG. 23, the same members as those shown in FIGS. 16 and 22 are designated with the same symbols, and the detailed explanation thereof will be omitted.

As shown in FIG. 23, a light emitting device 281 having a phosphor layer is characterized in that the device has a reflection mirror 282 which receives light emitted from the phosphor layer 202 and reflects the light toward the subject to be illuminated.

Thus, an end surface of the cover 274 on the light emitting side is provided with the reflection mirror 282 which opens toward the subject to be illuminated. The reflection mirror 282 is formed into a cup-like shape having a space 282A. The space 282A has a circular flat surface which becomes wider from the phosphor layer side toward the opening. The light emitting surface of the sealing member 205 is formed with the phosphor layer 202.

Figure 24:
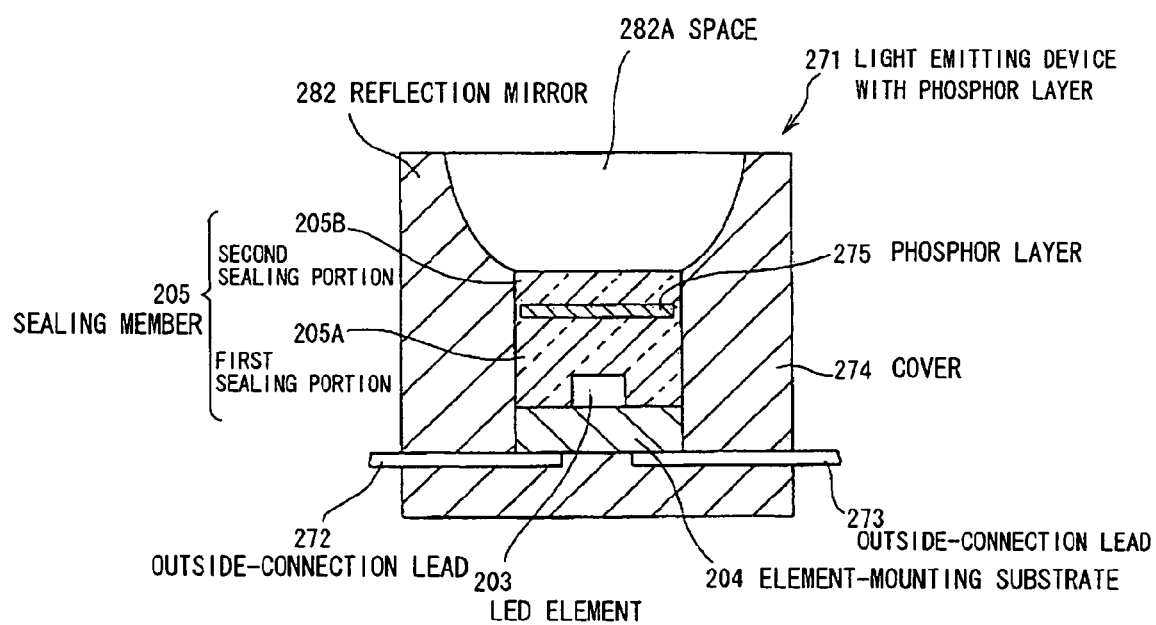
FIG. 24 is a sectional view showing a modification of the ninth embodiment.

Although the light emitting surface of the sealing member 205 is formed with the phosphor layer 202 in this embodiment, the present invention is not limited to this, and a phosphor layer 275 may be disposed in the sealing member 205 as shown in FIG. 24.

Effect of Ninth Embodiment

According to the ninth embodiment, the following effect can be obtained in addition to the effects (1) and (2) of the sixth embodiment.

Since the reflection mirror 282 receives the light emitted from the phosphor layer 202 and reflects the light toward the subject to be illuminated, high brightness irradiation light and excellent directivity can be obtained.

Tenth Embodiment

Figure 25:
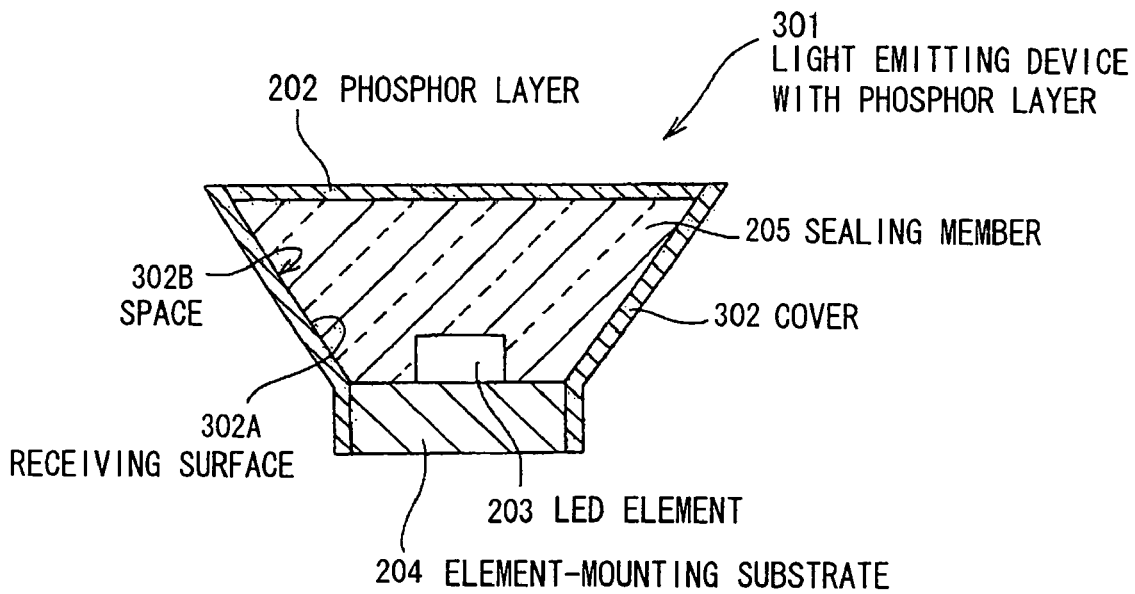
FIG. 25 is a sectional view showing a light emitting device having a phosphor layer according to a tenth embodiment of the invention.
Figure 26:
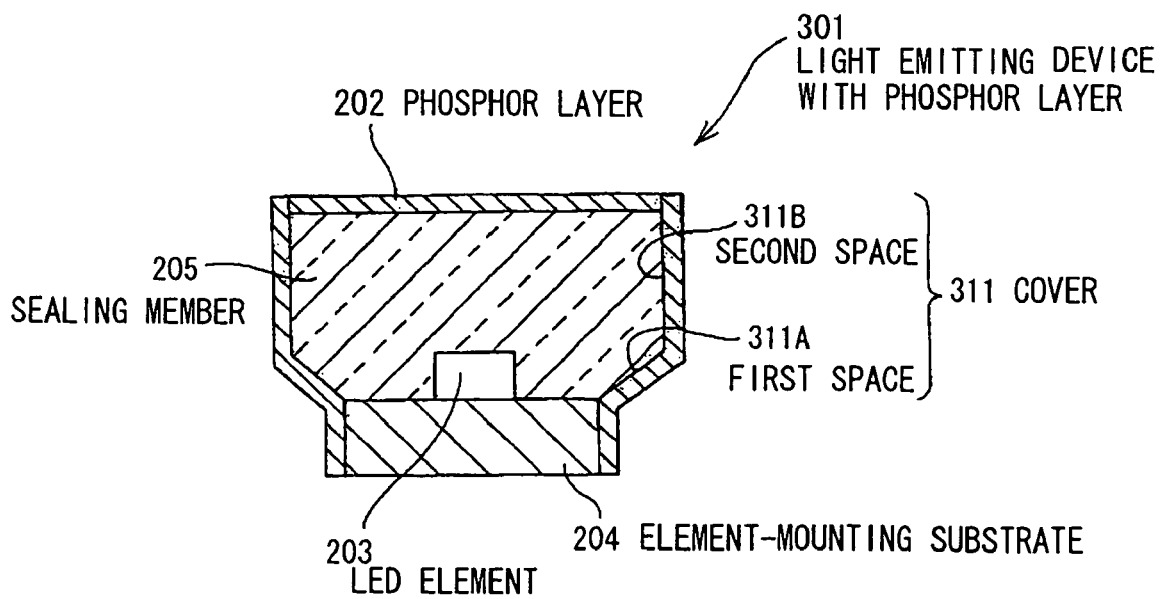
FIG. 26 is a sectional view showing a modification of the tenth embodiment.

FIG. 25 is a sectional view showing a light emitting device having a phosphor layer according to a tenth embodiment of the invention. In FIG. 25, the same members as those shown in FIG. 16 are designated with the same symbols, and the detailed explanation thereof will be omitted.

As shown in FIG. 25, a light emitting device 201 having a phosphor layer shown in the tenth embodiment is characterized in that the device has a cover 302 including a receiving surface 302A, which allows radiation light emitted from the LED element 3 to enter at an angle greater than a critical angle.

Thus, the cover 302 has an opening toward the subject to be illuminated and is formed into a cup-like shape having a space 302B, which has a truncated pyramid shape which becomes wider from the element-mounting side toward its opening.

The receiving surface 302A is not a reflection surface in this embodiment, but the present invention is not limited to this. The receiving surface 302A may have a reflection surface. In this case, the receiving surface 302A can receive the radiation light from the LED element 203 and can effectively totally reflect the light toward the phosphor layer.

Further, in this embodiment, the cover 302 is formed into a cup-like shape having a space 302B, which has a truncated pyramid shape which becomes wider from the element-mounting side toward its opening, but the present invention is not limited to this. The same effect can also be obtained by a cover 311 having a first space 311A having a truncated pyramid shape which becomes wider from the element-mounting side toward the subject to be illuminated, and a second space 311B having a square flat surface which is in communication with the first space 311A.

Effect of Tenth Embodiment

According to the above-described tenth embodiment, the following effect can be obtained in addition to the effects (1) and (2) of the sixth embodiment.

Since the receiving surface 302A can receive radiation light from the LED element 203 and totally reflect the light toward the phosphor layer, the light extraction efficiency can be enhanced by reducing the light absorption caused by the re-enter into the LED element 203.

Although the light emitting device having a phosphor layer of the present invention has been explained based on the embodiments, the invention is not limited to the embodiments, and the invention can be carried out in various modes without departing from its subject manner, and the following modifications can be made for example.

[Modifications]

(1) In the above embodiments, the phosphor layers 202, 262 and 275 receive radiation light (blue light) emitted from the LED element 203 and are excited and irradiate yellow wavelength conversion light, but the invention is not limited to this, and the LED element may irradiate near-ultraviolet light (wavelength is 370 to 390 nm), and the phosphor layer may receive the radiation light from the LED element and is excited and may irradiate the white wavelength conversion light. As the wavelength is shorter, the sealing material is more deteriorated, but the glass sealing does not have this problem.

(2) The light emitting device 201 includes the phosphor layer which is in parallel to the mounting surface of the LED element 203 and a side surface reflection surface which is perpendicular to the mounting surface in the embodiments, the present invention is not limited to this. For example, the light emitting device may have a phosphor layer provided on one of side surfaces which is perpendicular to the mounting surface, and an upper surface which is in parallel to the other surface and the mounting surface, and these surfaces may be reflection surfaces.

(3) The phosphor layer is formed only on the light extraction side in the embodiments, but a phosphor layer may be formed on the reflection frame or the element-mounting substrate. With this structure, if the blue light emitted from the LED element is converted into yellow light, the light absorption at the circuit pattern plated with gold can be reduced. Since it is possible to reduce the thickness of the phosphor layer on the light extraction side, the light absorption in the light emitting device can be reduced.

Although the invention has been described with respect to the specific embodiments for complete and clear disclosure, the appended claims are not to be thus limited but are to be constructed as embodying all modifications and alternative constructions that may occur to one skilled in the art which fairly fall within the basic teaching herein set forth.

What is claimed is:

1. A method of producing a light emitting device, comprising:
   a first step of mounting a plurality of surface mounting type light emitting elements on an insulative substrate at predetermined distances from one another;
   a second step of forming a glass sealing member with uniform thickness, by hot-pressing, such as to cover the plurality of light emitting elements, the glass sealing member comprising a low melting point glass and directly contacting said light emitting elements; and
   a third step of cutting the substrate and the glass sealing member such that a tapered surface is formed around each of the plurality of light emitting elements, wherein in the third step, the substrate and the glass sealing member are cut by a tapered blade having a cutting edge angle corresponding to an angle of the tapered surface.

2. The method of producing a light emitting device according to claim 1, wherein:
   in the third step, the substrate and the glass sealing member are cut halfway by a first tapered blade having a cutting edge angle corresponding to the angle of the tapered surface and then, the glass sealing member is cut off by a second tapered blade having a blade width which is narrower than that of the first tapered blade until the glass sealing member is divided.

3. The method of producing a light emitting device according to claim 1, wherein:
   the glass sealing member comprises a plate-like glass sealing member and the second step comprises hot-pressing the plate-like glass sealing member.

4. The method of producing a light emitting device according to claim 1, wherein:
   the first step includes flip-chip mounting the plurality of surface mounting type light emitting elements on the insulative substrate.

5. A method of producing a light emitting device, the light emitting device comprising:
   a light emitting element;
   a plate-like ceramic substrate on which the light emitting element is mounted; and
   a glass sealing member that is bonded to an upper surface of the ceramic substrate for sealing the light emitting element and comprises a tapered surface such that a cross sectional area thereof in a lateral direction increases upward,
   said method comprising:
   a first step of flip-mounting the light emitting element on the ceramic substrate; and
   a second step of setting a plate-like low-melting-point glass parallel to the ceramic substrate, parallel-moving the low-melting-point glass to the upper surface of the ceramic substrate, and hot-pressing the low-melting-point glass onto the upper surface of the ceramic substrate, such that the glass sealing member is formed directly contacting the light emitting element to seal the light emitting element and bonded to the upper surface of the ceramic substrate.

6. The method according to claim 5, wherein, of the glass sealing member and the ceramic substrate, a lower thermal expansion coefficient member comprises a thermal expansion coefficient ratio of less than 0.85 to a higher thermal expansion coefficient member.

7. The method according to claim 6, further comprising:
   a third step of cutting the ceramic substrate and the glass sealing member such that said tapered surface is formed around the light emitting element.

8. The method according to claim 7, wherein
   the third step is conducted such that the ceramic substrate and the glass sealing member are cut by a tapered blade having a cutting edge angle corresponding to an angle of the tapered surface.

9. The method according to claim 7, wherein
   the third step is conducted such that the ceramic substrate and the glass sealing member are cut halfway by a first tapered blade having a cutting edge angle corresponding to an angle of the tapered surface, and then the glass sealing member is cut off by a second tapered blade having a blade width which is narrower than that of the first tapered blade until the glass sealing member is divided.

* * * * *